United States Patent
Yamada et al.

(10) Patent No.: US 10,879,436 B2
(45) Date of Patent: Dec. 29, 2020

(54) LIGHT EMITTING DEVICE

(71) Applicant: NICHIA CORPORATION, Anan (JP)

(72) Inventors: Motokazu Yamada, Tokushima (JP);
Tomonori Ozaki, Anan (JP)

( * ) Notice: Subject to any disclaimer, the term of this patent is extended or adjusted under 35 U.S.C. 154(b) by 0 days.

(21) Appl. No.: 15/061,390

(22) Filed: Mar. 4, 2016

(65) Prior Publication Data

US 2016/0260873 A1 Sep. 8, 2016

(30) Foreign Application Priority Data

Mar. 5, 2015 (JP) .................. 2015-044048
Feb. 26, 2016 (JP) .................. 2016-036266

(51) Int. Cl.
*H01L 33/56* (2010.01)
*H01L 33/50* (2010.01)

(52) U.S. Cl.
CPC ............. *H01L 33/56* (2013.01); *H01L 33/50* (2013.01); *H01L 33/502* (2013.01); *H01L 2224/73204* (2013.01); *H01L 2933/0091* (2013.01)

(58) Field of Classification Search
CPC ....... H01L 33/56; H01L 33/50; H01L 33/502; H01L 2933/0091; H01L 2224/73204
See application file for complete search history.

(56) References Cited

U.S. PATENT DOCUMENTS

| | | | |
|---|---|---|---|
| 6,788,874 B1* | 9/2004 | Ishikawa | G02B 6/02033 385/122 |
| 6,911,408 B2* | 6/2005 | Beunet | C03C 8/04 501/26 |
| 9,219,201 B1* | 12/2015 | Todorov | H01L 33/502 |
| 9,640,738 B2* | 5/2017 | Morimura | H01L 33/501 |

(Continued)

FOREIGN PATENT DOCUMENTS

| | | |
|---|---|---|
| CN | 103081143 A | 5/2013 |
| CN | 103688377 A | 3/2014 |

(Continued)

OTHER PUBLICATIONS

C. Markos et al., "Guiding and thermal properties of a hybrid polymer-infused photonic crystal fiber," vol. 2, No. 7, Optical Materials Express, Jul. 1, 2012, pp. 929-941.

(Continued)

*Primary Examiner* — Charles D Garber
*Assistant Examiner* — S M Sohel Imtiaz
(74) *Attorney, Agent, or Firm* — Hunton Andrews Kurth LLP

(57) ABSTRACT

A light emitting device having a light-emitting element, a covering resin covering the light-emitting element, a wavelength converting material contained in the covering resin, and a light diffusing agent contained in the covering resin is provided. The light diffusing agent contains glass particles. A first refractive index n1 of the covering resin at a peak wavelength of a light emitted by the light-emitting element (Continued)

and at 25° C. is in a range of 1.48 to 1.60, a second refractive index n2 of the covering resin at the peak wavelength and at 100° C. is at least 0.0075 lower than the first refractive index n1, and a third refractive index n3 of the light diffusing agent at the peak wavelength and at 25° C. is higher than the first refractive index n1.

33 Claims, 10 Drawing Sheets

(56) References Cited

U.S. PATENT DOCUMENTS

| | | | |
|---|---|---|---|
| 2002/0030194 A1* | 3/2002 | Camras | H01L 33/58 257/98 |
| 2006/0060882 A1 | 3/2006 | Ohe et al. | |
| 2006/0061263 A1 | 3/2006 | Sakuma et al. | |
| 2006/0098077 A1* | 5/2006 | Dowling | H05B 37/02 347/130 |
| 2006/0204195 A1 | 9/2006 | Kurosawa et al. | |
| 2008/0153008 A1* | 6/2008 | Hayashi | G02B 5/0252 430/2 |
| 2008/0250816 A1 | 10/2008 | Kurosawa et al. | |
| 2008/0253726 A1 | 10/2008 | Kurosawa et al. | |
| 2009/0008672 A1* | 1/2009 | Osawa | H01L 33/44 257/99 |
| 2009/0050911 A1 | 2/2009 | Chakraborty | |
| 2010/0149815 A1* | 6/2010 | Erchak | F21S 2/00 362/293 |
| 2011/0006668 A1* | 1/2011 | Hussell | H01L 33/501 313/499 |
| 2011/0018026 A1* | 1/2011 | Konno | H01L 33/50 257/100 |
| 2011/0057227 A1* | 3/2011 | Oberleithner | H01L 33/504 257/98 |
| 2011/0096103 A1* | 4/2011 | Kato | H04N 9/73 345/690 |
| 2011/0317283 A1* | 12/2011 | Shim | G02B 1/041 359/722 |
| 2012/0018772 A1* | 1/2012 | Nishijima | H01L 33/486 257/99 |
| 2012/0155061 A1 | 6/2012 | Manabe et al. | |
| 2012/0219774 A1* | 8/2012 | Kishimoto | C08J 5/18 428/212 |
| 2012/0243239 A1* | 9/2012 | Fukui | B60Q 3/82 362/311.01 |
| 2013/0015761 A1* | 1/2013 | Motoya | C03C 3/066 313/512 |
| 2013/0033870 A1* | 2/2013 | Suehiro | H01L 33/46 362/267 |
| 2013/0082294 A1* | 4/2013 | Nakayama | H01L 33/56 257/98 |
| 2013/0207148 A1* | 8/2013 | Krauter | H01L 33/58 257/98 |
| 2014/0028858 A1* | 1/2014 | Wu | H04N 17/04 348/189 |
| 2014/0042897 A1* | 2/2014 | Kamada | H01L 33/54 313/502 |
| 2014/0124812 A1 | 5/2014 | Kuramoto et al. | |
| 2014/0174523 A1* | 6/2014 | Ko | C09D 183/04 136/256 |
| 2014/0175478 A1 | 6/2014 | Wirth | |
| 2014/0264422 A1* | 9/2014 | Windisch | H01L 33/58 257/98 |
| 2015/0008817 A1* | 1/2015 | Okada | C09K 11/0883 313/503 |
| 2015/0028373 A1 | 1/2015 | Abe et al. | |
| 2015/0077966 A1 | 3/2015 | Bessho et al. | |
| 2015/0166888 A1* | 6/2015 | Katsumoto | C09K 11/7774 252/301.4 R |
| 2015/0221831 A1* | 8/2015 | Kim | H01L 33/62 257/98 |
| 2015/0311406 A1* | 10/2015 | Lange | H01L 25/0753 257/89 |
| 2015/0346397 A1* | 12/2015 | Linkov | G02B 5/0242 257/98 |
| 2015/0368552 A1* | 12/2015 | Izumi | C07F 7/21 428/215 |
| 2016/0003440 A1* | 1/2016 | Wataya | C09K 11/592 362/510 |
| 2016/0126221 A1* | 5/2016 | Windisch | H01L 25/0753 257/89 |
| 2016/0204319 A1* | 7/2016 | Swier | G03F 7/0007 428/339 |
| 2016/0264779 A1* | 9/2016 | Tajima | C08L 83/04 |
| 2017/0081241 A1* | 3/2017 | Sanderson | C03C 15/00 |

FOREIGN PATENT DOCUMENTS

| | | | |
|---|---|---|---|
| DE | 102012217643 A1 | 3/2014 | |
| EP | 1919000 A1 | 5/2008 | |
| JP | H11237652 A | 8/1999 | |
| JP | 2005024848 A | 1/2005 | |
| JP | 2006-093277 A | 4/2006 | |
| JP | 2007-266356 A | 10/2007 | |
| JP | 2009-054995 A | 3/2009 | |
| JP | 2012533175 A | 12/2012 | |
| JP | 2013-211250 A | 10/2013 | |
| JP | 2014-039006 A | 2/2014 | |
| JP | 2014-078691 A | 5/2014 | |
| JP | 2015026698 A | 2/2015 | |
| WO | 2006/006582 A1 | 1/2006 | |
| WO | 2011/142127 A1 | 11/2011 | |
| WO | 2013/154133 A1 | 10/2013 | |

OTHER PUBLICATIONS

A. Norris et al., "Silicone materials for optical applications," <http//www.dowcorning.com.cn/zh_CN/content/publishedlit/75-1007-01_single.pdf>, Jun. 1, 2003.

Extended European Search Report issued in European Application No. 16158663.1 dated Jul. 12, 2016.

* cited by examiner

LIGHT EMITTING DEVICE

CROSS-REFERENCE TO RELATED APPLICATIONS

This application claims the benefit of Japanese Patent Application No. 2015-044048 filed on Mar. 5, 2015, and Japanese Patent Application No. 2016-36266 filed on Feb. 26, 2016. The entire disclosures of Japanese Patent Application No. 2015-044048 and Japanese Patent Application No. 2016-36266 are incorporated by reference herein.

BACKGROUND

Technical Field

The present invention relates to light emitting devices.

Description of Related Art

In recent years, various electronic components have been proposed and put into practical use, and it has been desirable for these electronic components to have high performance. In particular, some electronic components need to maintain their performance for a long time under strict operating environments. Such electronic components include semiconductor light-emitting elements, including light emitting diodes (LEDs). For example, in the fields of general illumination and vehicle-mounted illumination, light emitting devices have been increasingly required to exhibit higher performance, specifically, higher output (higher brightness) and higher reliability. In particular, it is necessary for light emitting devices that exhibit high output to operate at high operating temperatures. In the fields of light sources for backlights, lighting apparatuses, and the like, adequate light diffusion properties have also been required.

In view of improving the light diffusing property of a light emitting device, a method of mixing a light diffusing agent into a sealing resin is known. For example, JP 2007-266356 A discloses a light scattering member arranged on an upper surface of a light-emitting element to suppress uneven intensity of light radiation. JP 2007-266356 A also discloses a configuration including a wavelength converting material.

However, when a light emitting device includes a covering resin that contains a wavelength converting material in addition to a light scattering material, a change in emission color may occur when there is a change in temperature.

SUMMARY

Accordingly, an object of certain embodiments of the present invention is to provide a light emitting device having little change in emission color with respect to a change in temperature.

A light emitting device according to certain embodiments of the present invention includes a light-emitting element, a covering resin covering the light-emitting element, a wavelength converting material contained in the covering resin, and a light diffusing agent contained in the covering resin. The light diffusing agent contains glass particles. At a peak wavelength of a light emitted by the light-emitting element and at a temperature of 25° C., the covering resin has a first refractive index n1 of 1.48 to 1.60; at the peak wavelength and at a temperature of 100° C., the covering resin has a second refractive index n2 that is at least 0.0075 lower than the first refractive index n1 (i.e., $n2 \leq n1 - 0.0075$); and at the peak wavelength and at a temperature of 25° C., the light diffusing agent has a third refractive index n3 that is higher than the first refractive index n1.

Thus, a light emitting device having little change in emission color with respect to a change in temperature is provided.

Embodiments of the present invention may be more fully understood from the description of the preferred embodiments as set forth below, together with the accompanying drawings.

DETAILED DESCRIPTION

Figure 1A:
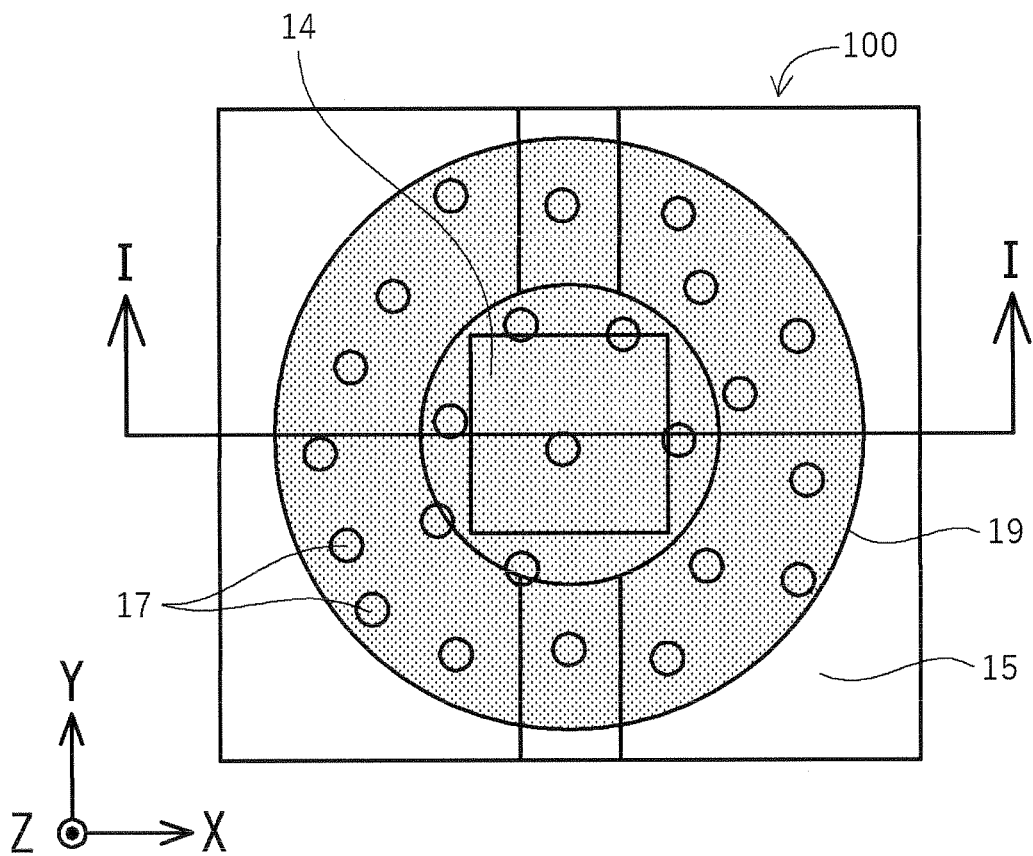
FIG. 1A is a schematic top view showing an example of a light emitting device according to a first embodiment.

Embodiments of the present invention will be described below with reference to the accompanying drawings. A light emitting device described below is to give a concrete form to technical ideas of the present invention and is not intended to limit the scope of the present invention. Configurations described in one embodiment or example can be applied to other embodiments and examples. In the description below, the same designations or reference numerals denote the same or similar members, respectively, and a duplicative detailed description thereof will be omitted as appropriate.

Further, regarding each component configuring the present invention, a plurality of structural elements that configures the present invention may be configured as a single part that serves the purpose of a plurality of elements. Or, vice versa, a single structural element may be configured as a plurality of parts which serve the purpose of a single element.

First Embodiment

Figure 1B:
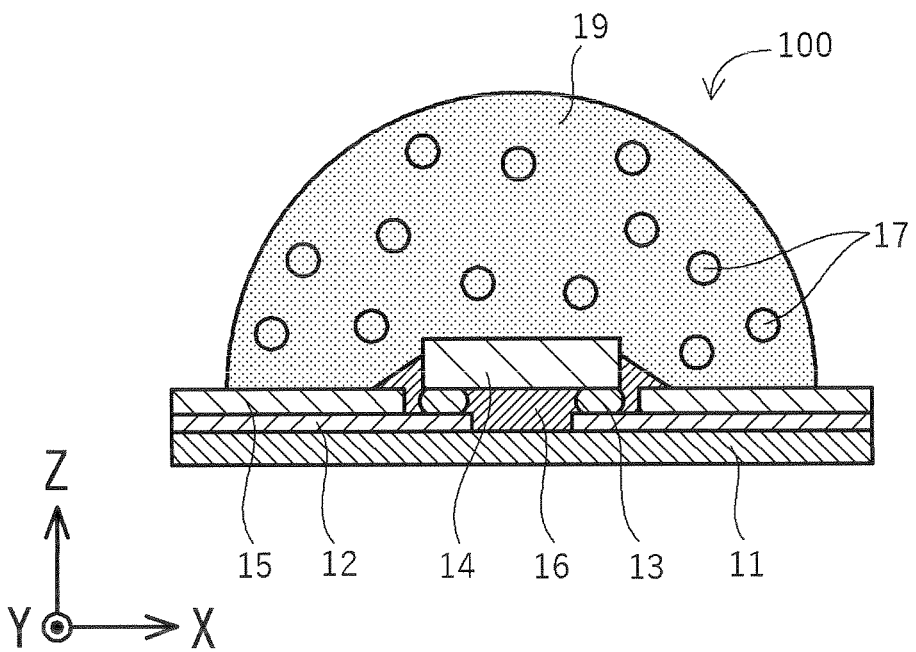
FIG. 1B is a schematic cross-sectional view showing an example of a light emitting device according to the first embodiment.

FIGS. 1A and 1B are schematic structural diagrams showing an example of a light emitting device 100 according to a first embodiment. FIG. 1A is a schematic top view of the light emitting device 100, and FIG. 1B is a schematic cross-sectional view taken along the line I-I of FIG. 1A.

Figure 2:
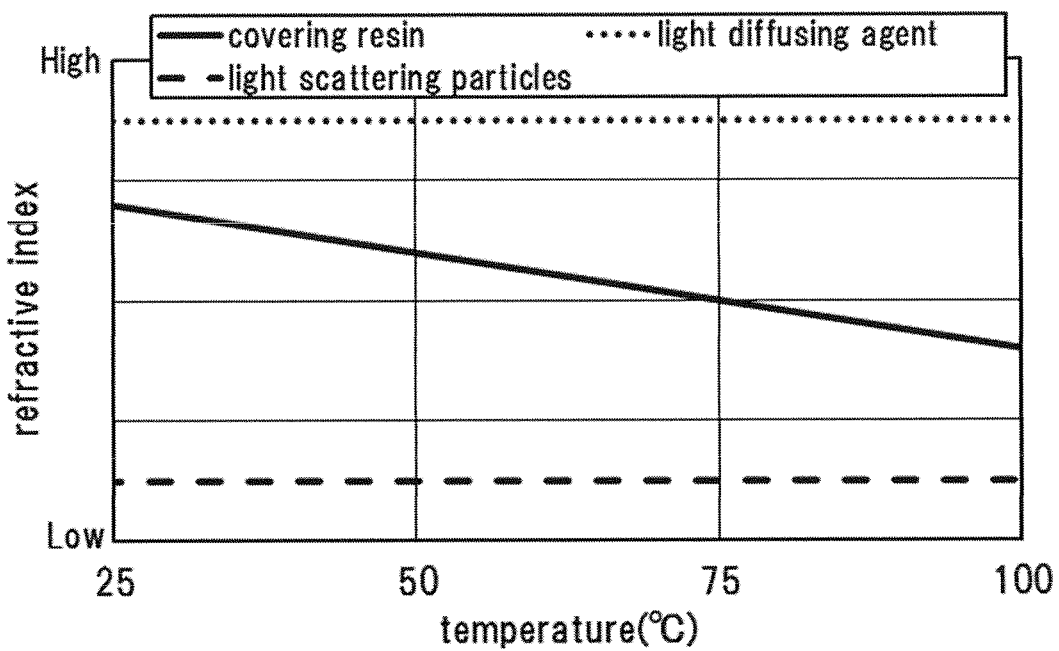
FIG. 2 is a diagram illustrating changes in refractive indices of a covering resin, a light diffusing agent, and light scattering particles according to changes in temperature.

FIG. 2 is a diagram illustrating exemplary changes in refractive indices of a covering resin, a light diffusing agent, and light scattering particles according to changes in temperature. One or more of a covering resin, a light diffusing agent, and light scattering particles are included in the different embodiments disclosed herein.

The light emitting device 100 according to the first embodiment includes a light-emitting element 14, a covering resin 19, and a light diffusing agent 17.

The light-emitting element 14 is mounted in a flip-chip manner via bonding members 13 on a pair of conductive wirings 12 disposed on a surface of a base substrate 11. A large portion of the conductive wirings 12 is covered by an insulating member 15, but a region of an upper surface of each conductive wiring 12 that is electrically connected to the light-emitting element 14 is exposed out of the insulating member 15. An underfill 16 is disposed under the light-emitting element 14 (i.e., between the light-emitting element 14 and the base substrate 11) and at the lateral side surfaces of the light-emitting element 14.

The covering resin 19 containing the light diffusing agent 17 is disposed on the light-emitting element 14 (on a light extracting surface side of the light-emitting element 14).

The covering resin 19 has a refractive index that is smaller at 100° C. than at 25° C. Therefore, a difference in refractive index between the refractive index of the covering resin 19 and the refractive index of air is smaller at 100° C. than at 25° C. Accordingly, the amount of light emitted from the light-emitting element 14 that is surface-reflected or totally-reflected at an interface between the covering resin 19 and the air is smaller at 100° C. than at 25° C. As a result, at 100° C., there is a reduction in the amount of light that remains within the covering resin 19 and is scattered by the light diffusing agent 17.

For this reason, in order to reduce a change in the light distribution characteristics, it is preferable that a difference in refractive indices of the covering resin 19 at 25° C. and at 100° C. be as small as possible. However, according to certain embodiments of the present invention, the change in the light distribution characteristics of the light emitting device due to a change in temperature can be reduced even in the case of using, for the covering resin 19, a material having a refractive index at 100° C. that is 0.0075 or more smaller than its refractive index at 25° C. (i.e., refractive index at 100° C.≤refractive index at 25° C.−0.0075).

The covering resin 19 contains the light diffusing agent 17 having a refractive index greater than or equal to the refractive index of the covering resin 19 at 25° C. The difference in refractive index between the refractive index of the covering resin 19 and the refractive index of the light diffusing agent 17 at 100° C. can be larger than at 25° C. by using a material for the light diffusing agent 17 that has a refractive index with a temperature coefficient smaller than the temperature coefficient of the refractive index of the covering resin 19. Accordingly, a ratio of the amount of light that is emitted from the light-emitting element 14 to the amount of light that is scattered and reflected at the interface between the covering resin 19 and the light diffusing agent 17 can be increased at 100° C., when compared to 25° C.

As discussed, the amount of light that is surface-reflected or totally-reflected at the interface between the covering resin 19 and the air decreases with rising temperature. But with the inclusion of the light diffusing agent 17, the amount of light that is reflected at the interface between the covering resin 19 and the light diffusing agent 17 increases. Consequently, the amount of light scattering in the covering resin 19 can be made substantially constant even if the temperature changes. Thus, a change in the light distribution characteristics due to a change in the temperature can be reduced.

However, an excessively large difference in refractive index between the refractive index of the light diffusing agent 17 and the refractive index of the covering resin 19 at 25° C. may reduce a relative change in the refractive index due to a difference in temperature, leading to a reduction in the rate of increase in the amount of light scattering due to the rise in the temperature, so that the compensating effect of the amount of light scattering may be significantly reduced. Therefore, the refractive index of the light diffusing agent 17 at 25° C. is preferably greater than or equal to that of the covering resin 19. In particular, the difference in refractive index between the refractive index of the light diffusing agent 17 and the refractive index of the covering resin 19 is in a range of 0 to 0.15, more preferably in a range of 0 to 0.1, and even more preferably in a range of 0 to 0.05.

An appropriate difference in refractive indices of the covering resin 19 at 25° C. and at 100° C. may vary, but the refractive index of the covering resin 19 at 100° C. is preferably smaller than that of the refractive index of the covering resin 19 at 25° C. by a range of 0.0075 to 0.075. Setting the difference in refractive indices of the covering resin 19 at 25° C. and at 100° C. within this range can facilitate the control of scattering light.

The covering resin 19 preferably has a higher refractive index because the higher the refractive index of the covering resin 19, the smaller a difference in refractive index between the refractive index of the covering resin 19 and the refractive index of the light-emitting element 14, allowing for improvement in the light extraction efficiency of the light-emitting element 14. Thus, the covering resin 19 of an appropriate refractive index at 25° C. can be employed, but a refractive index of 1.45 or higher is preferable, and a refractive index of 1.5 or higher is more preferable.

In the case where the temperature coefficient of the light diffusing agent 17 is smaller than the temperature coefficient of the covering resin 19, the difference in the refractive indices of the light diffusing agent 17 at 25° C. and at 100° C. is smaller than a difference in refractive indices of the covering resin 19 at 25° C. and at 100° C.

As described above, in the light emitting device 100 of the first embodiment, the light diffusing agent 17 is included in the covering resin 19, so that the temperature dependence of the light distribution characteristics can be reduced even if the refractive index of the covering resin 19 changes with temperature.

Second Embodiment

Figure 3A:
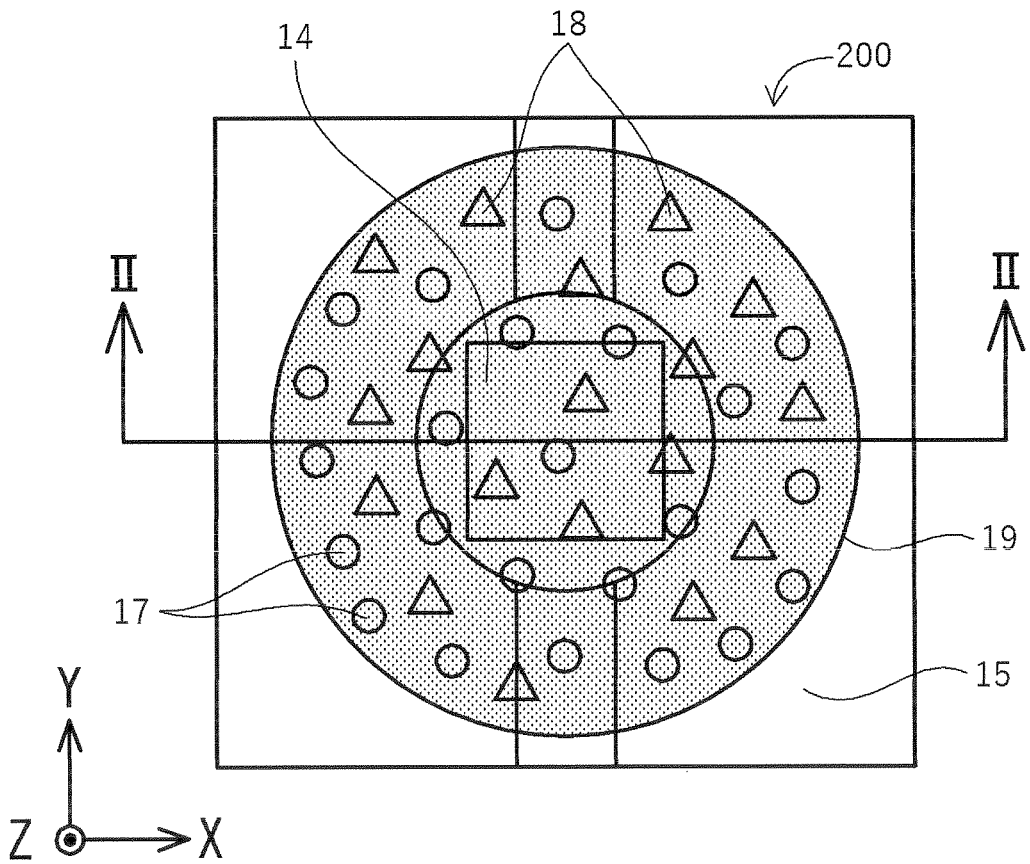
FIG. 3A is a schematic top view showing an example of a light emitting device according to a second embodiment.
Figure 3B:
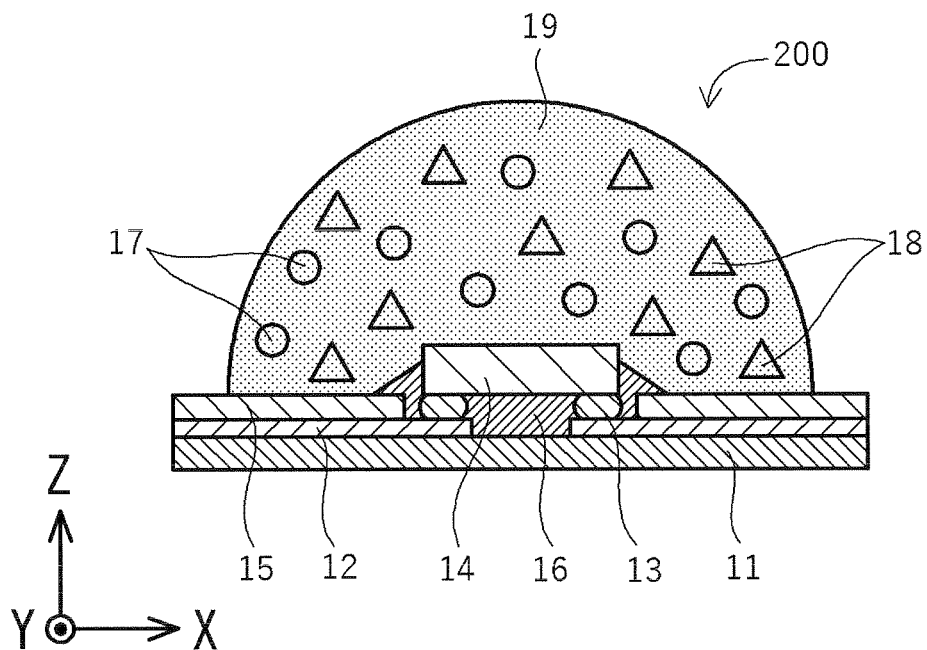
FIG. 3B is a schematic cross-sectional view showing an example of a light emitting device according to the second embodiment.

FIGS. 3A and 3B are schematic configuration diagrams showing an example of a light emitting device 200 in a second embodiment. FIG. 3A is a schematic top view of the light emitting device 200, and FIG. 3B is a schematic cross-sectional view taken along the line II-II of FIG. 3A.

The light emitting device 200 according to the second embodiment includes a light-emitting element 14, a covering resin 19, a light diffusing agent 17, and light scattering particles 18. The light emitting device 200 of the second embodiment differs from the light emitting device 100 of the first embodiment in that the covering resin 19 contains the light scattering particles 18, in addition to the light diffusing agent 17. The second embodiment is of substantially the same configuration as that disclosed in the first embodiment except for the inclusion of the light scattering particles 18.

The covering resin 19, which contains the light diffusing agent 17 and the light scattering particles 18, is formed on the light-emitting element 14 (on the light extracting surface side of the light-emitting element 14).

The refractive index of the light scattering particles 18 is equal to or smaller than the refractive index of the covering resin 19 at 100° C. Additionally, the temperature coefficient of the refractive index of the light scattering particles 18 is smaller than that of the covering resin 19. As such, a difference in refractive index between the refractive index of the covering resin 19 and the refractive index of the light scattering particles 18 at 25° C. is larger than the difference at 100° C. Thus, the light emitted from the light-emitting element 14 is scattered at the interface between the covering resin 19 and the light scattering particles 18 by a larger amount at 25° C. than at 100° C. That is, the light scattering particles 18 may enhance the light scattering property of the light emitting device 200 at 25° C., compared with that at 100° C.

With the inclusion of the light scattering particles 18, even in the case where increasing the concentration of the light diffusing agent 17 in the covering resin 19 increases the light distribution angle by enhancing the scattering of light at 100° C., scattering of light can also be enhanced at 25° C. Therefore, scattering of the light can be controlled with ease with respect to changes in temperature.

In other words, the difference in refractive index between the refractive index of the covering resin 19 and the refractive index of the light diffusing agent 17 and the difference in refractive index between the refractive index of the covering resin 19 and the refractive index of the light scattering particles 18 may compensate for each other. Thus, the temperature dependence of the light distribution property may be reduced, even if the refractive index of the covering resin 19 changes with the temperature.

It is to be noted that an excessively large difference in refractive index between the refractive index of the light diffusing agent 17 and the refractive index of the covering resin 19 at 25° C. may result in a small relative change in the refractive index corresponding to the difference in the temperature, which may reduce the rate of increase in the amount of light scattering due to the rise in the temperature. When the light scattering particles 18 are included, the light diffusing agent 17 of an appropriate refractive index at 25° C. can be employed, but the refractive index of the light diffusing agent 17 is preferably greater than or equal to that of the covering resin 19. For example, it is preferable that the difference in refractive index between the refractive index of the light diffusing agent 17 and the refractive index of the covering resin 19 is in a range of 0 to 0.15, more preferably in a range of 0 to 0.1, and even more preferably a range of 0 to 0.05.

However, an excessively large difference in refractive index between the refractive index of the light scattering particles 18 and the refractive index of the covering resin 19 at 100° C., may result in a small relative change in the refractive index corresponding to the difference in the temperature, which may reduce the rate of increase in the amount of light scattering due to the rise in the temperature. Therefore, the light scattering particles 18 of an appropriate refractive index at 100° C. can be employed, but a refractive index that is the same or smaller than that of the covering resin 19 by a range of 0 to 0.1 is preferable.

The difference between the refractive index of the covering resin 19 and the refractive index of the air at 100° C. is smaller than that at 25° C. Thus, the difference in refractive index between the refractive index of the covering resin 19 and the refractive index of the light diffusing agent 17 at 100° C. is preferably larger than that between the refractive index of the covering resin 19 and the refractive index of the light scattering particles 18 at 25° C., and a change in the light distribution characteristics corresponding to a change in the temperature can be reduced.

In the case where the temperature coefficient of the refractive index of the light scattering particles 18 is smaller than that of the covering resin 19, a difference in refractive indices of the light scattering particles 18 at 25° C. and at 100° C. is smaller than a difference in refractive indices of the covering resin 19 at 25° C. and at 100° C.

As described above, in the light emitting device 200 of the second embodiment, the light diffusing agent 17 and the light scattering particles 18 are included in the covering resin 19, allowing for a reduction in temperature dependence of light distribution characteristics even if the refractive index of the covering resin 19 changes with temperature.

In the present disclosure, a measurement wavelength of the refractive indices is set to a D line (589 nm), unless otherwise specified. Furthermore, in the present disclosure, the term "difference in refractive index" is represented by an absolute value, unless otherwise specified.

A refractive index can be measured, for example, with an Abbe refractometer. In the case where the refractive index of a component cannot be measured with the Abbe refractometer because of the size or the like of the component, the component is specified, and a refractive index of a material similar to the specified component is measured. Then, the refractive index of the specified component can be deduced from the measurement result of the similar material.

Preferred configurations of the light emitting devices according to the first and second embodiments described above and components in third to seventh embodiments to be described below will now be described.

Base Substrate 11

The base substrate 11 serves to mount the light-emitting element 14 thereon. A pair of conductive wirings 12, which serves to supply electric power to the light-emitting element, is disposed on a surface of the base substrate 11.

Examples of a material for the base substrate 11 include resins, such as a phenol resin, an epoxy resin, a polyamide resin, a polyimide resin, a BT resin, polyphthalamide (PPA), polyethylene terephthalate (PET), and ceramics. Among these materials, a resin is preferably selected as an insulating material in terms of low cost and ease of molding. In order to provide a light emitting device with good heat resistance and light resistance, a ceramic material is preferably selected as the material for the base substrate 11.

Examples of ceramic materials include alumina, mullite, forsterite, glass ceramics, nitrides-based materials (e.g., AlN), and carbide-based materials (e.g., SiC). Among these ceramic materials, a ceramic material made of alumina or containing alumina as a major component is preferable.

In the case of using a resin as the material for the base substrate 11, an inorganic filler, such as glass fiber, $SiO_2$, $TiO_2$, or $Al_2O_3$, is mixed into the resin to improve mechanical strength, to reduce thermal expansion coefficient, to improve optical reflectivity, and so forth, of the base substrate 11.

A metal substrate made of a metal member can also be used for the base substrate 11, in which case an insulating layer can be disposed thereon to insulatingly separate the pair of conductive wirings 12.

Conductive Wiring 12

The conductive wirings 12 are components electrically connected to the respective electrodes of the light-emitting element 14 and serve to supply external current (power) to the light-emitting element 14. That is, the conductive wirings 12 serve as electrodes or as a part of the electrodes for supplying external electrical power, and are generally disposed spaced apart from each other as at least two electrodes including a positive electrode and a negative electrode.

Each conductive wiring 12 is formed on at least an upper surface of the base substrate 11 that serves as a mounting surface of the light-emitting element 14. A material for the conductive wirings 12 can be selected as appropriate, according to the material of the base substrate 11, and to the method of manufacturing, or the like. For example, in the case of using a ceramic material for the base substrate 11, a material for the conductive wirings 12 preferably has a high melting point to endure the sintering temperature of a ceramic sheet, such as tungsten or molybdenum, is preferably used for the conductive wiring. Further, other metal materials, such as nickel, gold, and/or silver may be disposed to cover the conductive wirings 12 by using plating, sputtering, vapor deposition, etc.

In the case of using a glass epoxy resin (e.g., glass fiber filled epoxy resin) as a material of the base substrate 11, an easily processable material is preferable for the conductive wirings 12, and for example, copper can be used. In the case of using an injection-molded epoxy resin as the material for the base substrate 11, the material for the conductive wirings 12 is preferably a material that can withstand processes such as punching, etching, bending, etc. and that has a relatively high mechanical strength, and in this case, for example, copper can be used as the material for the conductive wirings 12. Specific examples of the conductive wirings 12 can include a metal layer or a lead made of a metal such as copper, aluminum, gold, silver, tungsten, iron, nickel, iron-nickel alloy, phosphor bronze, iron-containing copper, or molybdenum. The surface of the conductive wirings 12 may be further covered by a metal material that can be appropriately selected. For example, silver may be used alone, or an alloy of silver with copper, gold, aluminum and/or rhodium may be used. Alternatively, materials may be applied as a multilayer film of silver and/or alloys described above.

Examples of methods for disposing the metal material include sputtering, vapor deposition, and the like in addition to plating.

Bonding Member 13

A bonding member 13 serves to fix the light-emitting element to the base substrate or to the conductive wiring 12. For the bonding member 13, an insulating resin or a conductive member can be used. In flip-chip mounting, a conductive member is used as the bonding member. Specific examples of material of the bonding member include an Au-containing alloy, an Ag-containing alloy, a Pd-containing alloy, an In-containing alloy, a Pb—Pd containing alloy, an Au—Ga containing alloy, an Au—Sn containing alloy, a Sn-containing alloy, a Sn—Cu containing alloy, a Sn—Cu—Ag containing alloy, an Au—Ge containing alloy, an Au—Si containing alloy, an Al-containing alloy, a Cu—In containing alloy, and a mixture of metal and flux.

The bonding member 13 can be applied in a liquid form, a paste form, or a solid form (e.g., a sheet form, a block form, a powder form, or a wire form), appropriately selected according to the composition of the bonding member 13, the shape of the base substrate, and the like. The bonding member 13 may be formed of a single member, or a combination of several types of the above-described members or forms.

Insulating Member 15

The conductive wirings 12 are preferably covered by an insulating member 15 except for a portion to be electrically connected to the light-emitting element 14 and other elements. That is, a resist for insulating and covering the conductive wirings 12 may be arranged on the base substrate. The insulating member 15 can serve as such a resist.

In the case of disposing the insulating member 15, in addition to the purpose of insulating the conductive wirings 12, in order to improve the light extraction efficiency of the light emitting device 14, a white filler (such as used in the underfill 16 material to be described below) can be contained in the insulating member 15 so as to reduce leakage or absorption of light.

For the insulating member 15, an insulating material that absorbs little of the light that is emitted from the light-emitting element 14 can be appropriately selected. Examples of a material for the insulating member 15 include an epoxy resin, a silicone resin, a modified silicone resin, a urethane resin, an oxetane resin, an acrylic resin, a polycarbonate resin, and a polyimide resin.

Light-Emitting Element 14

For the light-emitting element 14 mounted on the base substrate 11, any appropriate light-emitting element can be used, but in the embodiments described herein, a light-emitting diode (LED) is preferably used as the light-emitting element 14.

The light-emitting element of any appropriate wavelength can be selected. For example, for a blue light-emitting element and a green light-emitting element, a nitride-based semiconductor ($In_xAl_yGa_{1-x-y}N$, $0 \leq x$, $0 \leq y$, $x+y \leq 1$), GaP, ZnSe, or the like can be used. For a red light-emitting element, GaAlAs, AlInGaP, or the like can be used. Further, a semiconductor light-emitting element using other materials can also be employed. The composition, emission color, size, and the number of light-emitting elements can be selected as appropriate according to, for example, the intended use.

The emission wavelength of the light-emitting element 14 can be chosen, for example, by selecting the materials of the semiconductor layer and the ratio of the mixed crystals. The light-emitting element 14 may include a positive electrode and a negative electrode that may be disposed on the same surface side or on different surfaces of the light-emitting element 14.

The light-emitting element 14 according to the present disclosure may include a light-transmissive substrate and a layered semiconductor layer on the light-transmissive substrate. The layered semiconductor layer includes an n-type semiconductor layer, an active layer, and a p-type semiconductor layer stacked in this order. An n-type electrode is formed on the n-type semiconductor layer, and a p-type electrode is formed on the p-type semiconductor layer.

The light-emitting element 14 can be mounted in a flip-chip manner, in which, through the bonding members 13, the electrodes of the light-emitting element 14 are connected to the conductive wirings 12 on a surface of the base substrate 11 and the surface opposite to the surface on which the electrodes are disposed. That is, a main surface of the light-transmissive substrate may serve as a light extracting surface. Meanwhile, in the case of face-up mounting, in which the light-emitting element 14 is mounted on the surface of the base substrate 11 opposite from the surface having the electrodes, the surface having the electrodes serves as the light extracting surface.

The light-emitting element 14 is disposed across the two conductive wirings 12 of the positive side and negative side that are insulatingly separated from each other, and is electrically connected and mechanically fixed to the conductive wirings 12 via the conductive bonding members 13. In this case, the light-emitting element 14 can be mounted by using, in addition to a mounting method using a solder paste, a mounting method using bumps. A small-sized packaged light-emitting element in which a light-emitting element is sealed by a covering resin or the like can be used as the light-emitting element 14, and a light-emitting element of an appropriate shape and structure can also be employed.

As will be described below, in the case where a light emitting device includes a wavelength converting material, a nitride semiconductor that can emit light of a short wavelength to efficiently excite the wavelength converting material is preferable.

Underfill 16

In the case of mounting the light-emitting element 14 in a flip-chip manner, an underfill 16 is preferably disposed between the light-emitting element 14 and the base substrate 11. The underfill 16 contains a filler in order to allow light from the light-emitting element 14 to be effectively reflected, and to allow a thermal expansion coefficient of the underfill 16 to be close to that of the light-emitting element 14.

For the underfill 16, a material that absorbs little light emitted from the light-emitting element 14 can be used. For example, an epoxy resin, a silicone resin, a modified silicone resin, a urethane resin, an oxetane resin, an acrylic resin, a polycarbonate resin, a polyimide resin, or the like can be used.

The filler contained in the underfill 16 is preferably a white filler, which can facilitate reflection of light, so that the light extraction efficiency can be improved. An inorganic compound is preferably used for the filler. The term "white" as used herein includes the case where the filler looks white because of scattering of the light due to a difference in refractive index between the refractive index of the filler and the refractive index of a material around the filler even though the filler itself is transparent.

The reflectance of the filler is preferably 50% or more, more preferably 70% or more, with respect to a peak wavelength of a light emitted by the light-emitting element 14. With this arrangement, the light extraction efficiency of a light emitting device can be improved. The particle size of the filler is preferably in a range of 1 nm (nanometer) to 10 µm (micrometers). With this range of the particle size of the filler, the resin fluidity of the underfill 16 can be improved, enabling the underfill 16 to sufficiently cover even a narrow space. The particle size of the filler is preferably in a range of 100 nm to 5 µm, and more preferably in a range of 200 nm to 2 µm. The filler may have a spherical shape or a scale-like shape.

It is preferable that a lateral side surface of the light-emitting element 14 is not covered by the underfill 16 by appropriately selecting and adjusting the particle size of the filler and the material for the underfill 16. This allows the lateral side surface of the light-emitting element 14 to serve as the light extracting surface.

Covering Resin 19

The covering resin 19 is a member disposed on the light extracting surface side of the light-emitting element 14 to protect the light-emitting element from outside environment and to optically control the light emitted from the light-emitting element 14. The covering resin may directly cover the light-emitting element, or may be disposed over the light-emitting element separated by an air layer or the like, without directly covering the light-emitting element 14.

Examples of a material for the covering resin 19 can include an epoxy resin, a silicone resin, and a mixed resin of these. Among these materials, a silicone resin is preferably selected in view of light resistance and ease of forming In particular, in the case where a gas barrier property is necessary, it is preferable to use a phenyl silicone resin as the material for the covering resin 19.

The covering resin 19 contains the light diffusing agent 17 that serves to diffuse light emitted from the light-emitting element 14. Including the light diffusing agent 17 allows the light emitted from the light-emitting element 14 to be diffused into substantially all directions.

The covering resin 19 can contain, in addition to the light diffusing agent 17, a wavelength converting material such as phosphors, which absorbs light from the light-emitting element 14 and emit light with a different wavelength from that of light emitted from the light-emitting element 14. The covering resin 19 can also contain a coloring agent corresponding to the color of light emitted from the light-emitting element 14.

The covering resin 19 can be formed so as to cover the light-emitting element 14 by using compression molding or injection molding. Alternatively, it is also possible that the viscosity of the covering resin 19 material be optimized and then the covering resin 19 material be dropped or drawn on the light-emitting element 14 to enable formation of a convex shape by utilizing the surface tension of the covering resin 19 material.

The method of forming the covering resin 19 by dropping or drawing as described above does not require a mold, and thus is simpler when compared to a method that requires a mold. The viscosity of the material for the covering resin 19 in this method can be adjusted by using the above-described light diffusing agent 17, the wavelength converting material, and the coloring agent, so that the material for the covering resin 19 with a desired viscosity, which is different from original viscosity of the material for the covering resin 19, can be obtained.

Light Diffusing Agent 17 and Scattering Particles 18

Examples of the light diffusing agent 17 and the light scattering particles 18 include oxides such as $SiO_2$, $Al_2O_3$, $Al(OH)_3$, $MgCO_3$, $TiO_2$, $ZrO_2$, $ZnO$, $Nb_2O_5$, $MgO$, $Mg(OH)_2$, $SrO$, $In_2O_3$, $TaO_2$, $HfO$, $SeO$, $Y_2O_3$, $CaO$, $Na_2O$, $B_2O_3$, $SnO$, and $ZrSiO_4$, nitrides such as $SiN$, $AlN$, and $AlON$, and fluorides such as $MgF_2$, $CaF_2$, $NaF$, $LiF$, and Na$_3$AlF$_6$. At least one of these materials may be singly used or melted and mixed to be used as glass or the like. Alternatively, these materials may be stacked to form a multilayer.

In particular, using glass allows for appropriately controlling the refractive index of the light diffusing agent 17 and the light scattering particles 18. A particle size of the light diffusing agent 17 and the light scattering particles 18 may be in a range of 0.01 µm to 100 µm, for example. The content of the light diffusing agent 17 and the light scattering particles 18 needs to be adjusted and can be determined appropriately according to the volume of the covering resin 19 and the particle size of the light diffusing agent 17 and the light scattering particles 18.

Third Embodiment

Figure 4A:
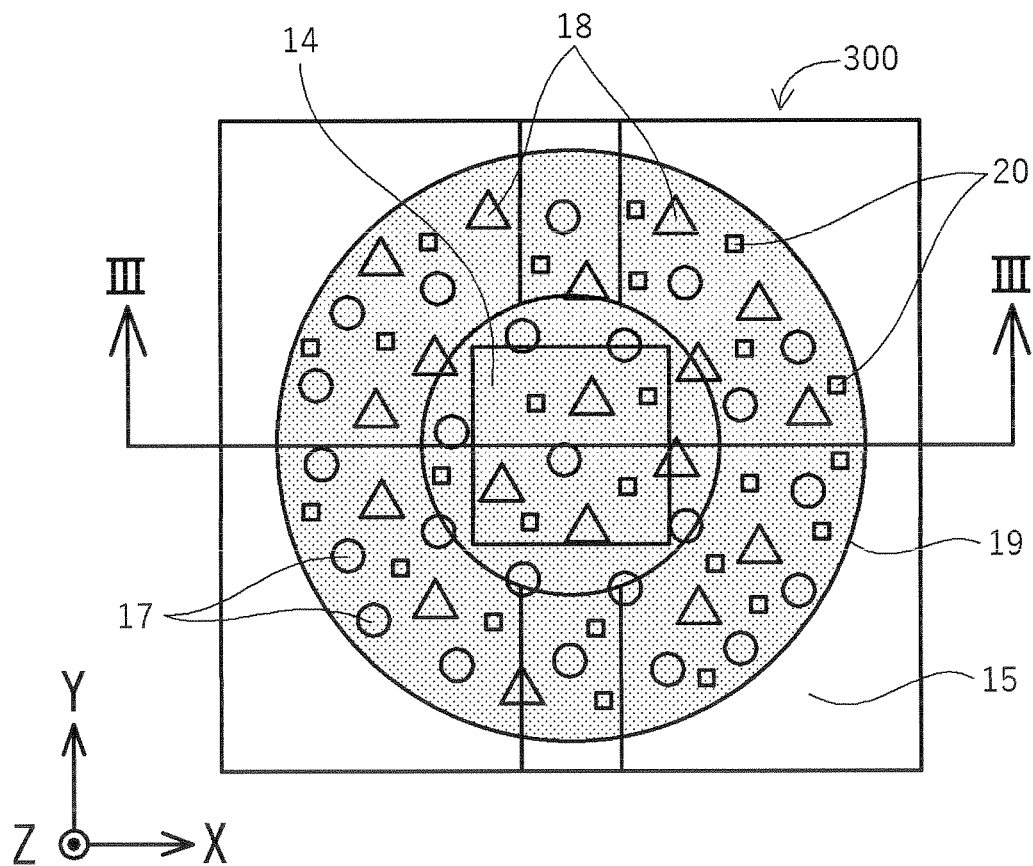
FIG. 4A is a schematic top view showing an example of a light emitting device according to a third embodiment.
Figure 4B:
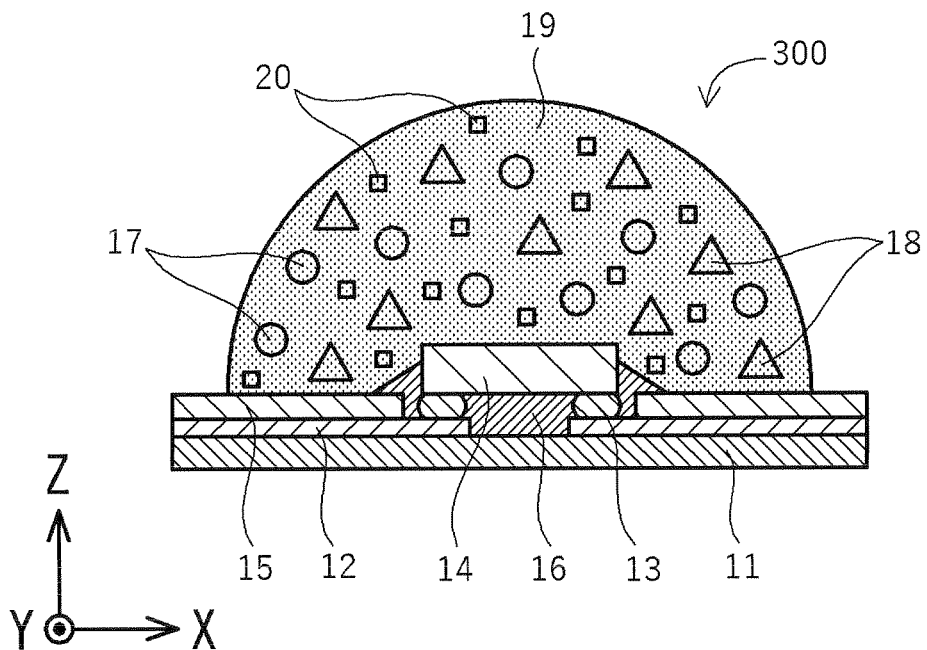
FIG. 4B is a schematic cross-sectional view showing an example of a light emitting device according to the third embodiment.

FIGS. 4A and 4B show schematic structural diagrams of an example of a light emitting device 300 in a third embodiment. FIG. 4A is a schematic top view of the light emitting device 300, and FIG. 4B is a schematic cross-sectional view taken along the line III-III of FIG. 4A.

The light emitting device 300 in the third embodiment includes the light-emitting element 14 to emit a first light, the covering resin 19, the light diffusing agent 17, and the wavelength converting material 20 to be excited by at least a portion of the first light emitted from the light-emitting element 14 and emit a second light with a wavelength longer than a wavelength of the first light. The light emitting device 300 according to the third embodiment may contain the light scattering particles 18 if necessary. The third embodiment differs from the light emitting device 200 of the second embodiment in that the covering resin 19 contains wavelength converting material 20 in addition to light diffusing agent 17 and the light scattering particles 18.

In the light emitting device 300, the covering resin 19 containing the light diffusing agent 17 and the wavelength converting material 20 is formed on the light-emitting element 14 (that is, on the light extracting surface side of the light-emitting element 14).

The light emitting device 300 can be, for example, a white LED, that specifically includes a blue LED as the light-emitting element 14 and yellow phosphors as the wavelength converting material 20. In a light emitting device including a blue LED and yellow phosphors, at least a portion of a blue light emitted from the blue LED and a yellow light emitted from the yellow phosphors, which are excited by at least a portion of the blue light emitted from the blue LED, are mixed together, so that a white light can be obtained.

In a light emitting device that achieves a desired emission color by mixing a first light emitted from a light-emitting element and a second light emitted from a wavelength converting material, a change in a mixing ratio between the first light and the second light leads to a change in emission color. In general, a fluorescent emission efficiency of the wavelength converting material is decreased as the temperature of the wavelength converting material increases.

If the temperature of the light emitting device is increased by driving of the light emitting device or the like, the fluorescent emission efficiency of the wavelength converting material is reduced. In the light emitting device including the blue LED and the yellow phosphors, as the temperature of the light emitting device is increased, an amount of yellow light is reduced, thus changing a ratio of an amount of the blue light to that of the yellow light, causing the chromaticity of the white light to shift to the blue light side (that is, an x value and a y value on the CIE (Commission Internationale de l'Eclairage, the International Commission on Illumination) chromaticity coordinates become small. It is to be noted that the chromaticity of light emitted by the light emitting devices herein is described in terms of the CIE chromaticity coordinates. However, one skilled in the art would appreciate that other chromaticity coordinates are similarly applicable.

In the light emitting device 300 of the third embodiment, the fluorescent emission efficiency of the wavelength converting material 20 may decrease when the temperature of the light emitting device is increased. Therefore, as the temperature of the light emitting device 300 is increased by driving of the light emitting device 300 or the like, the fluorescent emission efficiency of the wavelength converting material 20 may decrease.

Accordingly, in the light emitting device 300 of the third embodiment, the refractive index of the covering resin 19, urate of change in the refractive index of the covering resin 19, and the refractive index and content of the light diffusing agent 17 are determined based on a decrease in fluorescent emission efficiency of the wavelength converting material 20 due to an increase in temperature.

As such, the light emitting device 300 is configured so that the ratio (mixing ratio) of the amount of the first light emitted from the light-emitting element 14 to the amount of the second light emitted from the wavelength converting material 20 changes less easily with temperature.

More specifically, the light emitting device 300 according to the third embodiment may be configured so that the mixing ratio of the first light to the second light changes less easily with temperature even in the case where the fluorescent emission efficiency of the wavelength converting material 20 decreases with an increase in temperature, as described below.

In the case where the fluorescent emission efficiency of the wavelength converting material 20 decreases due to an increase in temperature, the ratio of the first light to the second light will relatively increase, assuming that the portion of the first light that excites the wavelength converting material 20 changes less easily with an increase in temperature. Consequently, the emission color of the light emitting device may be changed.

In this respect, the light diffusing agent 17 can increase an amount of scattering of the first light, thereby increasing the amount of the first light for exciting the wavelength converting material 20. That is, in the case where the amount of scattering of the first light by the light diffusing agent 17 is increased, the possibility of irradiating the first light to the wavelength converting material 20 will increase, thus increasing the amount of the first light absorbed by the wavelength converting material 20. Consequently, the amount of the second light can be increased.

For this reason, the light emitting device 300 according to the third embodiment may be configured such that the amount of scattering of the first light by the light diffusing agent 17 increases according to an increase in temperature to reduce a change in emission color due to a decrease in fluorescent emission efficiency of the wavelength converting material 20.

The third embodiment will be described below more specifically.

As shown in FIG. 2, the refractive index of a covering resin, such as the covering resin 19 decreases as the temperature increases (i.e., the covering resin has a negative temperature coefficient.)

In contrast, in the case where the light diffusing agent 17 is made of inorganic material, the temperature dependence of the refractive index of the light diffusing agent 17 is smaller than that of the covering resin and can be considered to be approximately constant.

The higher the reflectivity of the light diffusing agent 17, the larger the amount of scattering by the light diffusing agent 17 contained in the covering resin 19. And the larger the difference in refractive index between the refractive index of the covering resin 19 and the refractive index of the light diffusing agent 17, the higher the light reflectivity of the light diffusing agent 17.

Accordingly, the light emitting device 300 of the third embodiment has been devised such that:

(a) the refractive index of the covering resin 19 has a negative temperature dependence;

(b) the refractive index of the light diffusing agent 17 using inorganic material does not substantially have the temperature dependence; and (c) the larger the difference in refractive index between the refractive index of the covering resin 19 and the refractive index of the light diffusing agent 17, the larger the amount of scattering of light due to the light diffusing agent 17 contained in the covering resin.

Based on (a) to (c) above, in the light emitting device 300 of the third embodiment, the material for the covering resin 19 and the material for the light diffusing agent 17 are selected such that the refractive index (a third refractive index n3) of the light diffusing agent 17 at room temperature (25° C.) is higher than a first refractive index n1 of the covering resin 19 at room temperature (25° C.).

With this arrangement, the difference between the refractive index of the light diffusing agent 17 and the refractive index of the covering resin 19 increases in accordance with an increase in temperature. Thus, the amount of scattering of the first light by the light diffusing agent 17 can be increased in accordance with an increase in temperature. As such, a change in emission color due to the decrease of fluorescent emission efficiency of the wavelength converting material 20 can be reduced.

Here, particularly, a difference between the third refractive index n3 of the light diffusing agent 17 at room temperature (25° C.) and the first refractive index n1 of the covering resin 19 at room temperature (25° C.) is preferably in a range of 0.01 to 0.1, and more preferably in a range of 0.02 to 0.08. The content of the light diffusing agent 17 will be further described below.

In the light emitting device 300 of the third embodiment, the content of the light diffusing agent 17 in the covering resin 19 is determined so that a change in emission color due to a change in temperature is small, while considering the refractive index of the covering resin 19 and the temperature dependence of the refractive index thereof, as well as the refractive index of the light diffusing agent 17.

For example, the larger the content of the light diffusing agent 17 in the covering resin 19, the higher the increase rate of the amount of scattering of the first light due to the light diffusing agent 17 in accordance with an increase in temperature. In contrast, the smaller the content of the light diffusing agent 17 in the covering resin 19, the lower the increase rate of the amount of scattering of the first light due to the light diffusing agent 17 in accordance with an increase in temperature.

Thus, in the case where the effect of reducing the change in emission color, which is based on the difference in refractive index between the refractive index of the covering resin 19 and the refractive index of the light diffusing agent 17, is relatively small, increasing the content of the light diffusing agent 17 in the covering resin 19 allows for obtaining the effect of reducing the change in desired emission color.

In contrast, in the case where the light emitting device has a relatively great effect of reducing the change in emission color, which is based on the difference between the refractive index of the covering resin 19 and the refractive index of the light diffusing agent 17, decreasing of the content of the light diffusing agent 17 in the covering resin 19 allows for obtaining the effect of reducing the change in desired emission color.

For example, as shown in Example 1 to be described below, in a case where a silicone resin having a refractive index of 1.51 at room temperature is used as the covering resin 19, a glass filler having a refractive index of 1.52 at room temperature is used as the light diffusing agent 17, and 5 parts by weight of glass fillers is added to 100 parts by weight of resin, the effect of reducing the change in emission color of the light emitting device can be obtained, but the effect of reducing the change in emission color is smaller compared with a case of using a glass filler having a refractive index of 1.56 at room temperature. However, even in this case, increasing the amount of glass fillers into the resin allows for obtaining the effect of reducing the change in desired emission color.

As described above, in the light emitting device 300 according to the third embodiment, the content of the light diffusing agent 17 in the covering resin 19 is adjusted in view of the effect of reducing the change in emission color based on the refractive index of the covering resin 19, the temperature dependence of the refractive index of the covering resin 19, and the refractive index of the light diffusing agent 17. Thus, a light emitting device, whose emission color does not change in accordance with the change in temperature, can be provided.

In the case where the content of the light diffusing agent 17 in the covering resin 19 cannot be increased in order to satisfy other required performance, the refractive index of the covering resin 19 and the temperature dependence of the refractive index of the covering resin 19, as well as the refractive index of the light diffusing agent 17, are appropriately determined while the content of the light diffusing agent 17 in the covering resin 19 is determined to be small. In this case, a light emitting device, whose change in emission color with respect to the change in temperature is small, can be provided.

The Case of Containing Light Scattering Particles 18

In the light-emitting device 300 of the third embodiment, the covering resin 19 may contain the light scattering particles 18.

However, in the case of containing the light scattering particles 18, it is necessary to determine the refractive index of the light diffusing agent 17, the refractive index of the covering resin 19, the temperature dependence of the refractive index of covering resin 19, and the content of the light diffusing agent 17 in the covering resin 19, while considering the relationship between the refractive index of the light scattering particles 18 and the refractive index of the covering resin 19.

For example, a silica filler may be contained in the covering resin 19 in order to impart thixotropy required to form the covering resin 19 during a manufacturing process. The silica filler is the light scattering particles 18 having light diffusing property. The refractive index of the light scattering particles 18 made of the silica filler is 1.46. In the case where a silicone resin having a refractive index of 1.51 at room temperature is used as the covering resin 19, and the light scattering particles 18 having a refractive index of 1.46 are contained in the covering resin 19, the relationship of the refractive indices among the covering resin 19, the light diffusing agent 17, and the light scattering particles 18 is as shown in FIG. 2.

From a viewpoint of the amount of light-scattering by the light scattering particles 18 contained in the covering resin 19 based on the relationship shown in FIG. 2, the difference between the refractive index of the covering resin 19 and the refractive index of the light scattering particles 18 decreases in accordance with an increase in temperature. Accordingly, the amount of light diffusion amount due to the light scattering particles 18 decreases in accordance with an increase in temperature. This characteristic is opposite to that of the light diffusing agent 17 in which the amount of light diffusion increases in accordance with an increase in temperature. In the case where the covering resin 19 contains the light scattering particles 18 that have the refractive index smaller than the refractive index of the covering resin 19 in a desired range of temperature, the effect of reducing the change in emission color by the light diffusing agent 17 may be offset.

Accordingly, in the case where the covering resin 19 contains the light scattering particles 18 having the refractive index smaller than the refractive index of the covering resin 19, the respective refractive indices of the light diffusing agent 17 and covering resin 19, the temperature dependence of the refractive index of the covering resin 19, and the content of the light diffusing agent 17 in the covering resin 19 are required to be determined so as to compensate for the reduction in fluorescent emission efficiency of the wavelength converting material 20 due to the increase in temperature and for the decrease in the amount of light-scattering due to the light scattering particles 18 contained in the covering resin 19.

In the case where the covering resin 19 contains the light scattering particles 18 whose refractive index is larger than the refractive index of the covering resin 19 in a range of desired temperature, the difference between the refractive index of the covering resin 19 and the refractive index of light scattering particles 18 increases in accordance with an increase in temperature. This allows for a reduction in the change in emission color due to the decrease in fluorescent emission efficiency of the wavelength converting material 20 with an increase in temperature, similarly to the light diffusing agent 17. Therefore, in this case, for example, it is preferable that the content of the light scattering particles 18 in the covering resin 19 be decreased in view of the effect of reducing the change in emission color due to the light scattering particles.

In the light emitting device 300 of the third embodiment, the resin material forming the covering resin 19 can be appropriately selected from materials that can satisfy the above-described relationship with the light diffusing agent 17. However, for example, in view of the light extraction efficiency of the light emitted via the covering resin 19, the refractive index of the covering resin 19 at room temperature (referred to as a first refractive index $n1$ herein) is preferably in a range of 1.48 to 1.60. Preferably, the refractive index of the covering resin 19 at 100° C. (referred to as a second refractive index $n2$ herein) is lower than the first refractive index $n1$ of the covering resin 19 at room temperature, and a difference in refractive index between the first refractive index $n1$ and the second refractive index $n2$ is preferably equal to or greater than 0.0075. Using a resin having the refractive indices of such a range and a difference of the refractive indices $n1$ and $n2$ of such a range for the covering resin 19 allows for effectively reducing a change in emission color due to the covering resin 19 containing the light diffusing agent 17 in an amount typically used. The expression "the light diffusing agent 17 in an amount typically used" means that the content of the light diffusing agent 17 is in a range of 2 parts by weight to 15 parts by weight with respect to 100 parts by weight of resin. The content of the light diffusing agent 17 is preferably in a range of 3 parts by weight to 10 parts by weight, and more preferably 4 parts by weight to 7 parts by weight.

Preferably, the second refractive index $n2$ of the covering resin 19 at 100° C. is lower than the first refractive index $n1$ of the covering resin 19 at room temperature, and the difference between the first refractive index $n1$ and the second refractive index $n2$ of the covering resin 19 is preferably 0.03 or less. In the case where a difference between the first refractive index $n1$ and the second refractive index $n2$ of the covering resin 19 is larger than 0.03, fluctuations in the amount of light diffusion due to fluctuations in content (variation in content) of the light diffusing agent 17 in the covering resin 19 or due to the fluctuations in distribution (variations in distribution) of the light diffusing agent 17 in the covering resin 19 can increase.

In the present disclosure, each of the first refractive index $n1$, the second refractive index $n2$, and the third refractive index $n3$ is a value at the peak wavelength of the light-emitting element 14. The first refractive index $n1$, the second refractive index $n2$, and the third refractive index $n3$ may be measured directly at the peak wavelength of the light-emitting element 14, or may be calculated using a linear approximation between two values which are measured at different wavelengths.

The resin satisfying the above-described conditions of the refractive index can be selected from various kinds of resins including an epoxy resin, a silicone resin, and a mixed resin of these. A phenyl-based silicone resin can be preferably used as the resin. The term "phenyl-based silicone resin," as used in the present disclosure, indicates a silicone resin having a phenyl group, but the silicone resin may partly include an alkyl group, such as a methyl group. The refractive index and the temperature dependence of the refractive index of the phenyl-based silicone resin can be easily determined so as to be in ranges that satisfies the above-described relationship between the refractive indices. The phenyl-based silicone resin has lower gas permeability, for example, compared with other silicone resins such as the methyl-based silicone resin, and thus is suitable for the covering resin 19 for the light emitting device.

The light diffusing agent 17 preferably contains glass particles, which allows the light diffusing agent 17 to have a desired refractive index. In the present disclosure, glass means an amorphous inorganic material that may partly contain precipitated crystals.

The glass particles contained in the light diffusing agent 17 preferably have a refractive index in a range of 1.50 to 1.65, more preferably in a range of 1.52 to 1.60, and even more preferably in a range of 1.54 to 1.58 at the peak wavelength of the light-emitting element 14. With the glass particles having the refractive index in such ranges, the change in emission color due to decrease in fluorescent emission efficiency of the wavelength converting material 20 can easily be reduced, in combination with the covering resin 19 having the refractive index in the above-described range and temperature coefficient of the refractive index in such range.

Examples of the glass particles having a refractive index of 1.50 to 1.65 at the peak wavelength of the light-emitting element can include, for example, glass particles produced by melting, mixing, and pulverizing materials made of one or more materials selected from oxides such as $SiO_2$, $Al_2O_3$, $Al(OH)_3$, $MgCO_3$, $TiO_2$, $ZrO_2$, ZnO, $Nb_2O_5$, MgO, $Mg(OH)_2$, SrO, $In_2O_3$, $TaO_2$, HfO, SeO, $Y_2O_3$, CaO, $Na_2O$, $B_2O_3$, SnO, and $ZrSiO_4$, nitrides such as SiN, AlN, and AlON, and fluorides such as $MgF_2$, $CaF_2$, NaF, LiF, and $Na_3AlF_6$ as described above. In the third embodiment, particularly, the glass particles containing $SiO_2$ and $Al_2O_3$ are preferably used, and adjusting a compounding ratio of $SiO_2$ to $Al_2O_3$, and/or containing at least at least one selected from the group consisting of $B_2O_3$, CaO, $Na_2O$, $ZrO_2$, SrO, $F_2$, MgO, and ZnO allows the refractive index of the glass particle to be determined appropriately in a range of 1.50 to 1.65.

As described above, in the light emitting device 300 of the third embodiment, the covering resin 19 contains the light diffusing agent 17 having a refractive index higher than the refractive index of the covering resin 19 at 25° C., in addition to the wavelength converting material 20. At 100° C., the difference in refractive index between the refractive index of the covering resin 19 and the refractive index of the light diffusing agent 17 increases, increasing the amount of light-scattering in the covering resin 19. For example, in the light emitting device that includes a blue LED and yellow phosphors as the light-emitting element 14 and the wavelength converting material 20, respectively, the possibility that the blue light from the light-emitting element 14 strikes the wavelength converting material 20 is increased, increasing the amount of yellow light. Thus, the ratio of the blue light with respect to the yellow light can be controlled, so that changes in chromaticity of the emission light due to changes in temperature can be reduced.

Changes in emission color (chromaticity) can be represented, for example, by changes in respective x value and y value on the CIE chromaticity coordinates with respect to changes in temperature. The smaller a change in each of the x value and the y value on the CIE chromaticity coordinates with respect to a change in temperature, the more preferable it is. A change in the x value on the CIE chromaticity coordinates between 25° C. and 100° C. can be appropriately determined, but is preferably 0.01 or less, and more preferably 0.005 or less. A change in the y value on the CIE chromaticity coordinates between 25° C. and 100° C. can be appropriately determined, but is preferably 0.01 or less, and more preferably 0.005 or less.

The x value on the CIE chromaticity coordinates at 25° C. may be determined to be smaller than the x value on the CIE chromaticity coordinates at 100° C. in the above-described preferable range of the change in chromaticity. Accordingly, the chromaticity value can be shifted toward a value of higher spectral luminous efficiency on the CIE chromaticity coordinates, so that the decrease in luminous flux at a high temperature can be reduced.

It is to be noted that, in the present disclosure, a difference between values on the CIE chromaticity coordinates is represented by the absolute value unless otherwise specified. The method of measuring light distributions and chromaticity is based on the JIS (Japanese Industrial Standards).

Although an example in which the light scattering particles 18 are contained is shown in the third embodiment, the light scattering particles 18 are not necessarily required and may be added, for example, for the purpose of imparting the thixotropy or the like.

Wavelength Converting Material 20

The wavelength converting material 20 may be, for example, a material that serves to absorb light from the light-emitting element 14 including a nitride semiconductor as a light emitting layer and to convert the absorbed light into light with a wavelength different from the light from the light-emitting element 14. Examples of a fluorescent material of the wavelength converting material 20 can include, for example, a nitride-based phosphor, and an oxynitride-based phosphor, which are mainly activated by a lanthanoid element such as Eu or Ce. More specifically, the fluorescent material is preferably at least one selected from materials described in the paragraphs (D1) to (D3) below.

(D1) Phosphors mainly activated by a lanthanoid element, such as Eu, or by a transition metal element such as Mn, such as an alkaline-earth halogen apatite phosphor, an alkaline-earth metal haloborate phosphor, an alkaline-earth metal aluminate phosphor, an alkaline-earth metal sulfide phosphor, an alkaline-earth metal thiogallate phosphor, an alkaline-earth metal silicon nitride phosphor, a germanate phosphor, etc.

(D2) Phosphors mainly activated by a lanthanoid element such as Ce, such as a rare-earth aluminate phosphor, a rare-earth silicate phosphor, an alkaline-earth metal rare-earth silicate phosphor, etc.

(D3) Phosphors made of organic elements or organic complexes, etc., mainly activated by a lanthanoid element such as Eu.

Among those, an yttrium aluminum garnet (YAG) phosphor, which is a rare-earth aluminate phosphor mainly activated by a lanthanoid element such as Ce in the above (D2), is preferable. The YAG phosphors are represented by the following composition formulas (D21) to (D24) or the like.

$$Y_3Al_5O_{12}:Ce \qquad (D21)$$

$$(Y_{0.8}Gd_{0.2})_3Al_5O_{12}:Ce \qquad (D22)$$

$$Y_3(Al_{0.8}Ga_{0.2})_5O_{12}:Ce \qquad (D23)$$

$$(Y, Gd)_3(Al, Ga)_5O_{12}:Ce \qquad (D24)$$

For example, in the formulas described above, a part or all of Y may be substituted by Tb, Lu, or the like. More specifically, the phosphor may be $Tb_3Al_5O_{12}:Ce$, $Lu_3Al_5O_{12}:Ce$, etc. Further, any phosphor other than the above-described phosphor having performance, function, and effect that is similar to that of the above-described phosphor may be used.

Such a phosphor preferably has a particle size, for example, of approximately 2.5 to 30 μm.

Note that the term "particle size" as used in the present disclosure indicates an average particle size, which is indicated as a F.S.S.S.No. (Fisher Sub Sieve Sizer Number) determined by using an air-permeability method, which is represented by the so-called "D bar" (indicated by "D" with a bar above the "D").

The wavelength converting material 20 may be, for example, a light emitting substance that is a so-called nanocrystal, or quantum dot. Examples of such a light emitting substance can include semiconductor materials, for example, nanosized high-dispersion particles of II-VI group, III-V group, IV-VI group, or group semiconductors, and the like. More specifically, examples of the nanosized high-dispersion particles includes CdSe, core-shell type $CdS_X Se_{1-X}/ZnS$, GaP, InAs, InP, GaN, PbS, PbSe, $Cu(In, Ga)S_2$, $Ag(In, Ga)S_2$. Such quantum dot can have a particle size, for example, of 1 to 100 nm, and preferably approximately 1 to 20 nm (corresponding to a group of approximately 10 to 50 atoms). The use of the quantum dots with such a particle size can reduce the internal light-scattering, reducing scattering of light at a wavelength conversion region.

Fourth Embodiment

Figure 5A:
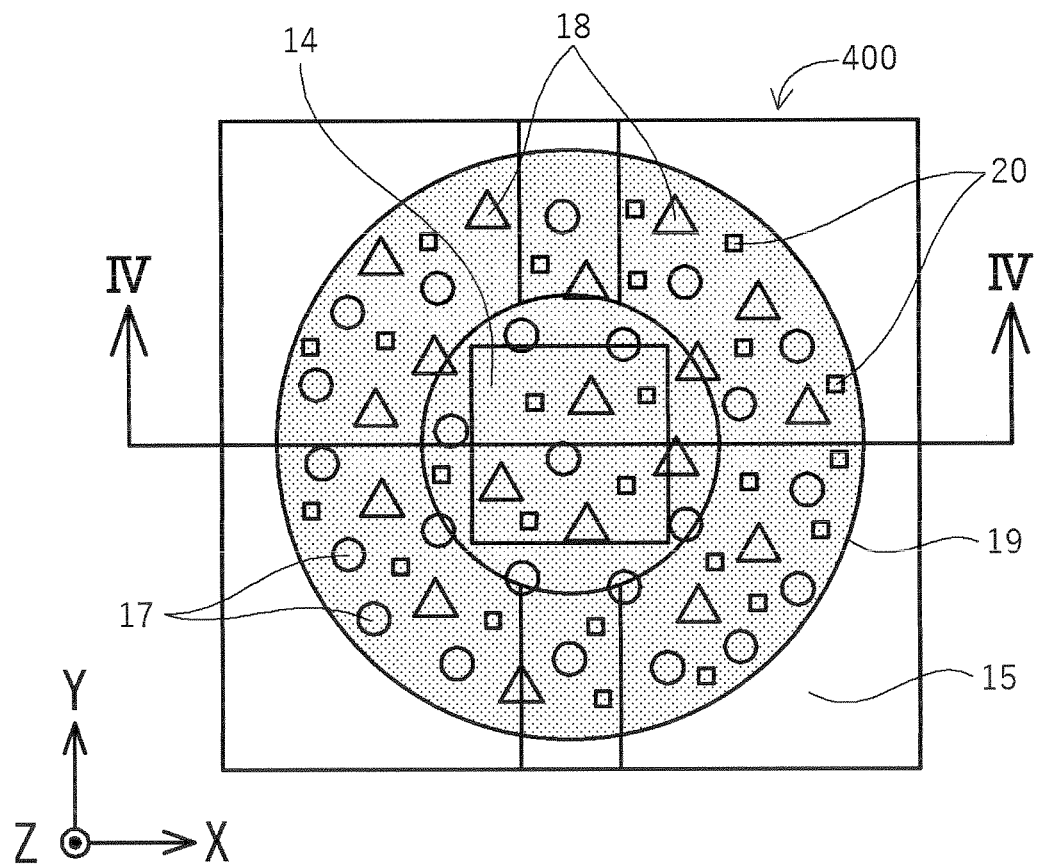
FIG. 5A is a schematic top view showing an example of a light emitting device according to a fourth embodiment.
Figure 5B:
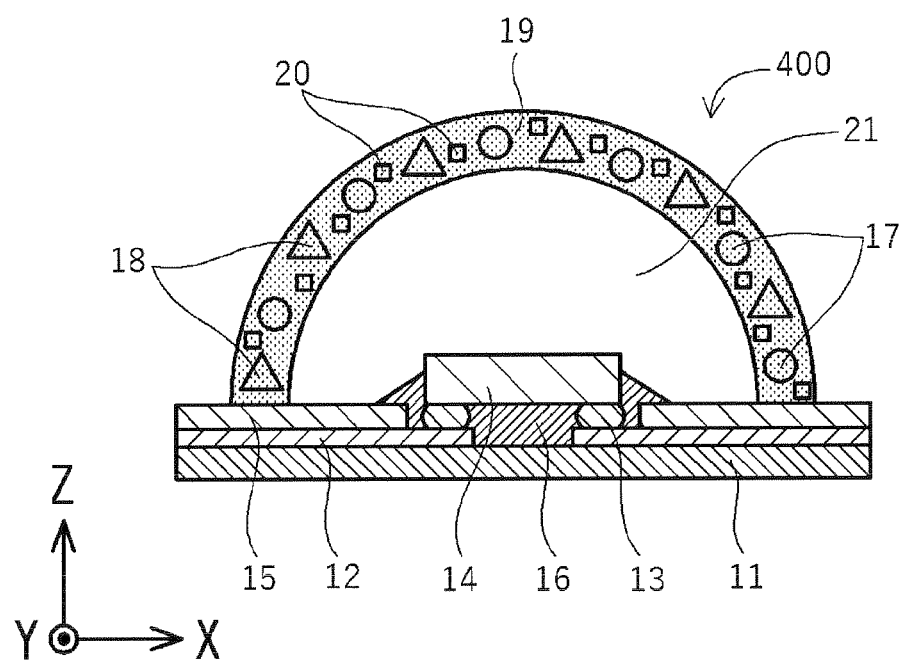
FIG. 5B is a schematic cross-sectional view showing an example of a light emitting device according to the fourth embodiment.

FIGS. 5A and 5B are schematic structural diagrams showing an example of a light emitting device 400 in a fourth embodiment. FIG. 5A is a top view of the light emitting device 400 and FIG. 5B is a cross-sectional view taken along the line IV-IV of FIG. 5A.

The light emitting device 400 of the fourth embodiment differs from the light emitting device 300 of the third embodiment in that the covering resin 19 is formed in a shape like a cap, and that the light-emitting element 14 and the covering resin 19 are separated from each other via an air layer 21.

Similarly to the third embodiment, in the light emitting device 400 of the fourth embodiment, the refractive index of the light diffusing agent 17, the refractive index of the covering resin 19 and its temperature dependence, and the content of the light diffusing agent 17 in the covering resin 19 are determined such that the change in emission color due to change in temperature is small. Accordingly, the light emitting device 400 of the fourth embodiment including the light-emitting element 14 and the covering resin 19, which are separated via the air layer 21, can be configured so that the emission color hardly changes with respect to changes in temperature.

Also, with this arrangement, the first light emitted from the light-emitting element 14 (for example, blue light) passing through the covering resin 19 can have approximately the same light path length across the entire covering resin 19. This allows the rate of the first light (blue light) that excites the wavelength converting material 20 to be approximately uniform across the covering resin 19, thus reducing color unevenness. Note that in the fourth embodiment, the covering resin 19 has the domical shape, but is not limited thereto, and for example, may be a plate-like shape.

Fifth Embodiment

Figure 6:
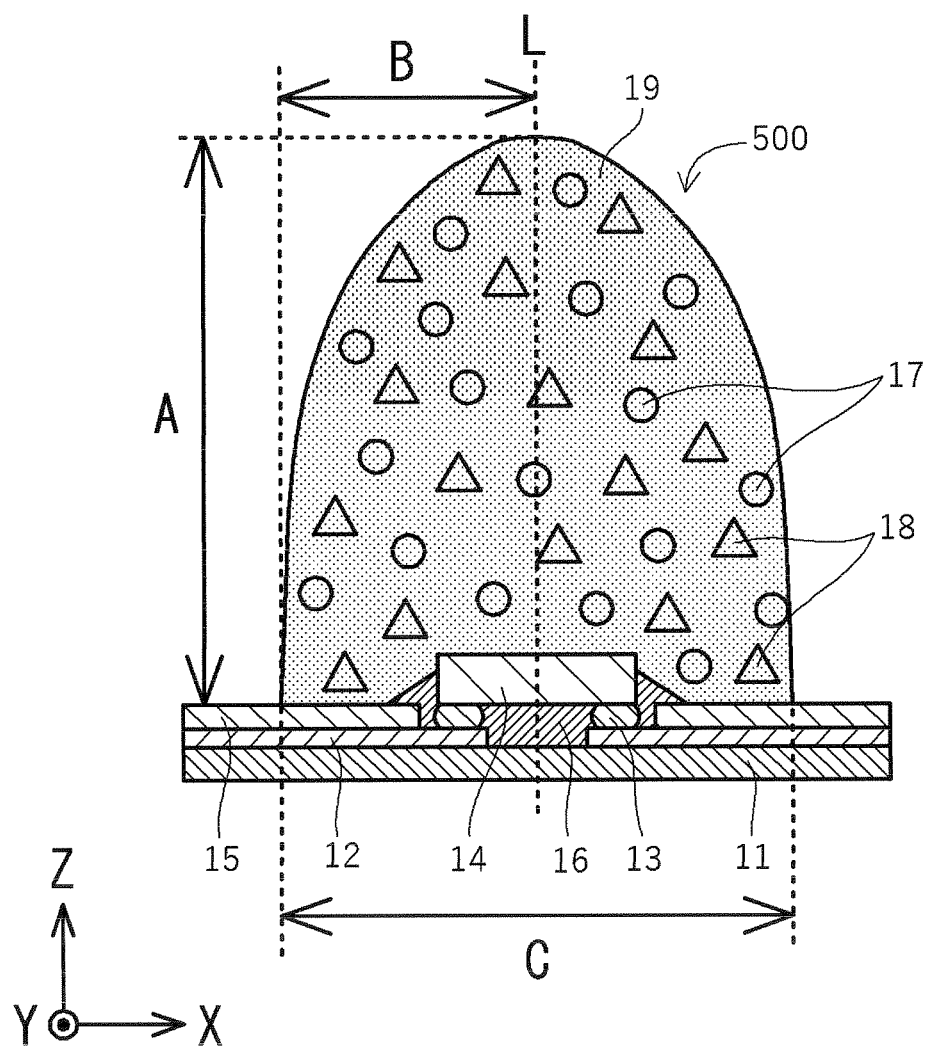
FIG. 6 is a schematic cross-sectional view showing an example of a light emitting device according to a fifth embodiment.

FIG. 6 is a cross-sectional view showing an example of a light emitting device 500 according to a fifth embodiment. The light emitting device 500 of the fifth embodiment differs from the light emitting device 200 of the second embodiment in that the covering resin 19 has a convex shape (for example, an approximately half-prolate-spheroid shape, or an approximately conical shape), and a height A of the covering resin 19 in the optical axis (L) direction is formed to be longer than a width C of the bottom surface of the covering resin 19. Note that a normal line passing through the center of the light-emitting element 14 is defined as the optical axis L.

Dropping resin that contains the light scattering particles 18 and that has high thixoropy allows the covering resin 19 to be formed with a length in the optical axis (L) direction longer than a width C of the bottom surface of the covering resin 19.

Figure 7:
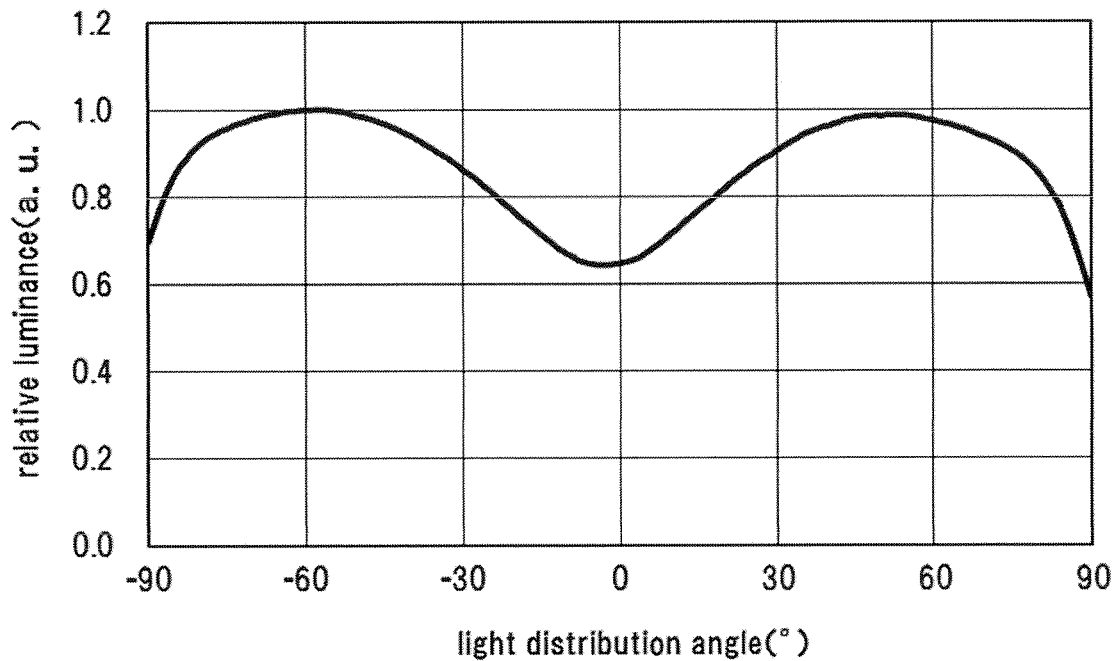
FIG. 7 is a diagram illustrating light distribution characteristics of a light emitting device according to the fifth embodiment.

In the light emitting device 500 of the fifth embodiment, the length in the optical axis (L) direction of the covering resin 19 is larger than the width C of the bottom surface of the covering resin 19, allowing the light emitted from the light-emitting element 14 to be scattered by the light diffusing agent 17 and the light scattering particles 18. With this, the intensity of the light emitted from the light emitting device 500 is substantially in proportion to an apparent area ratio of the covering resin 19. Accordingly, a bat-wing type light distribution characteristic can be achieved as shown in FIG. 7.

In the light-emitting device 500 of the fifth embodiment, the covering resin 19 may contain the wavelength converting material 20. In the light emitting device 500 of the fifth embodiment, in a case where the covering resin 19 contains the wavelength converting material 20, similarly to the third embodiment, the refractive index of the light diffusing agent 17, the refractive index of the covering resin 19, temperature dependence of the covering resin 19, and the content of the light diffusing agent 17 in the covering resin 19 are determined so as to reduce a change in emission color due to a change in temperature, such that the emission color changes less easily with respect to the change in temperature.

In a case of containing the light scattering particles 18 in the light emitting device 500 of the fifth embodiment, it is preferred to determine the refractive index of the light diffusing agent 17, the refractive index of the covering resin 19, a temperature dependence of the refractive index of the covering resin 19, and the content of the light diffusing agent 17 in the covering resin 19, in view of the relationship between the refractive index of the light scattering particles 18 and the refractive index of the covering resin 19.

Sixth Embodiment

Figure 8:
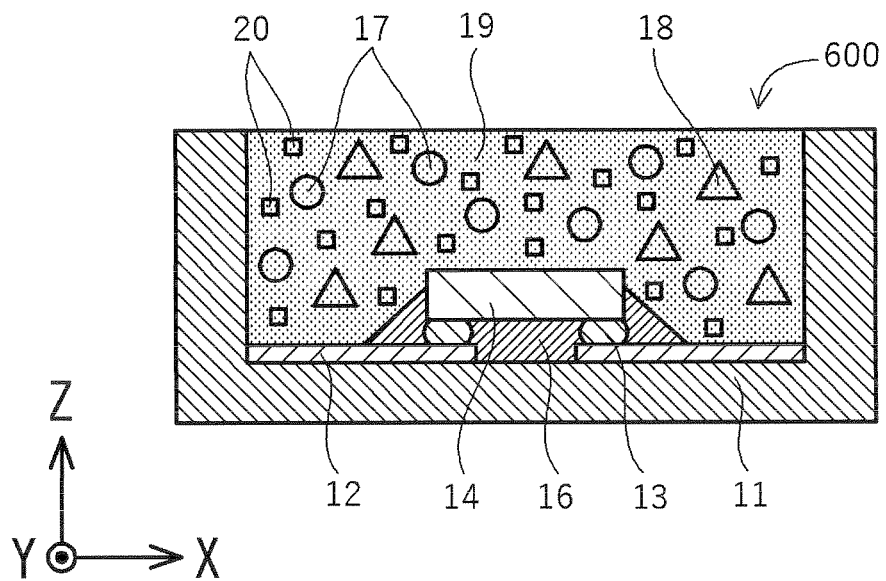
FIG. 8 is a schematic cross-sectional view showing an example of a light emitting device according to a sixth embodiment.

FIG. 8 is a cross-sectional view showing an example of a light emitting device 600 according to a sixth embodiment.

The light emitting device 600 of the sixth embodiment differs from the light emitting device 300 of the third embodiment in that a plurality of stacked ceramic green sheets are sintered to form the base substrate 11.

In the light emitting device 600 of the sixth embodiment, similarly to the third embodiment, the refractive index of the light diffusing agent 17, the refractive index of the covering resin 19 and its temperature dependence of the refractive index of the covering resin 19, and the content of the light diffusing agent 17 in the covering resin 19 are determined so as to reduce a change in the emission color with respect to a change in temperature. With this arrangement, the light emitting device 600 of the sixth embodiment allows the emission color to be substantially unchanged with respect to the change in temperature.

Furthermore, in the case where the light emitting device 600 of the sixth embodiment contains the light scattering particles 18, it is preferable to determine the refractive index of the light diffusing agent 17, the refractive index of the covering resin 19, the temperature dependence of the refractive index of the covering resin 19, and the content of the light diffusing agent 17 in the covering resin 19, in view of the relationship between the refractive index of the light scattering particles 18 and the refractive index of the covering resin 19.

In the light emitting device 600 of the sixth embodiment, the base substrate 11 has a recess. An upper surface of the recess has an opening, and the recess has lateral surfaces and a bottom surface. The conductive wirings 12 as electrodes are disposed on the bottom surface of the recess to be exposed and electrically connected to the light-emitting element 14, respectively. The recess is sealed with the covering resin 19 containing the light diffusing agent 17 and the light scattering particles 18. Arranging the light-emitting element 14 in the recess of the base substrate 11 can further protect the light-emitting element 14 from stress applied from the outside.

In each of the above-described light emitting devices of the first to sixth embodiments, in the covering resin 19, the wavelength converting material 20 may be present more densely in the vicinity of the light-emitting element 14 than in the vicinity of a light extracting surface of the light emitting device. Alternatively, the wavelength converting materials 20 may be present less densely in the vicinity of the light-emitting element 14 than in the vicinity of a light extracting surface of the light emitting device.

In each of the above-described light emitting devices of the first to sixth embodiments, in the covering resin 19, the light diffusing agent 17 may be present more densely in the vicinity of the light-emitting element 14 than in the vicinity of a light extracting surface of the light emitting device. Alternatively, the light diffusing agent 17 may be present less densely in the vicinity of the light-emitting element 14 than in the vicinity of a light extracting surface of the light emitting device.

Seventh Embodiment

Figure 9:
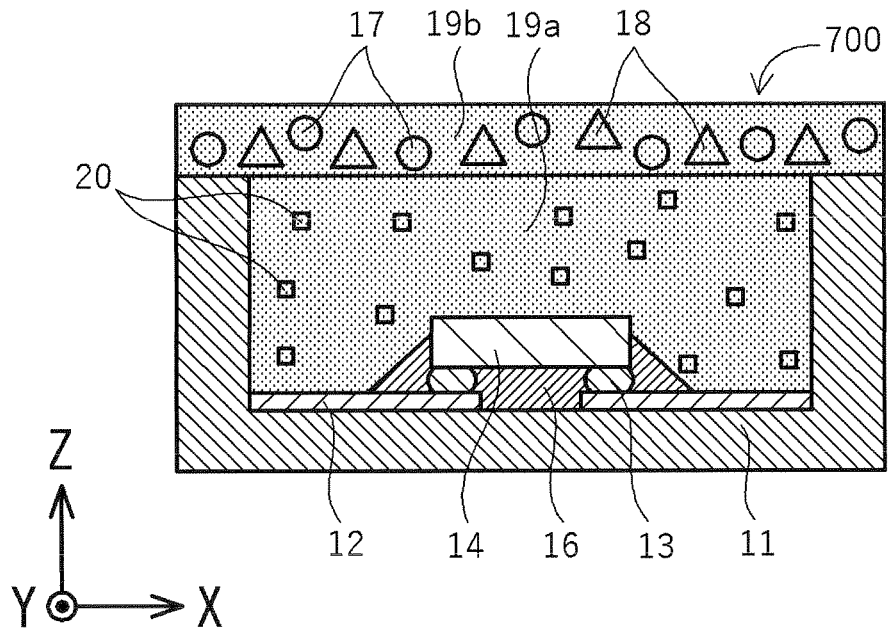
FIG. 9 is a schematic cross-sectional view showing an example of a light emitting device according to a seventh embodiment.

FIG. 9 is a cross-sectional view showing an example of a light emitting device 700 according to a seventh embodiment.

The light emitting device 700 of the seventh embodiment differs from the light emitting device 600 of the sixth embodiment in that the light-emitting element 14 is covered by a covering resin 19a (first covering resin portion) containing the wavelength converting material 20, and that a covering resin 19b (second covering resin portion) containing the light diffusing agent 17 and/or the light scattering particles 18 is formed closer to the light extracting surface (that is, outside) of the light emitting device 700 than to the covering resin 19a containing the wavelength converting material 20, so as to be separated from the covering resin 19a. In other words, the covering resin 19a containing the wavelength converting material 20 is separated from the covering resin 19b containing the light diffusing agent 17 and/or the light scattering particles 18. That is, the covering resin 19 is formed of two or more layers, in which a distance between the light-emitting element 14 and the layer of the covering resin 19a containing the wavelength converting material 20 is shorter than a distance between the light-emitting element 14 and the layer of the covering resin 19b containing the light diffusing agent 17.

The covering resin 19b may contain the light scattering particles 18 if necessary, or may contain only the light diffusing agent 17.

The covering resin 19b containing both of the light diffusing agent 17 and the light scattering particles 18 may not be independently formed. That is, at least the light diffusing agent 17 or light scattering particles 18 may be distributed densely at a part apart from the light-emitting element 14.

A resin material that forms the covering resin 19b containing the light diffusing agent 17 or light scattering particles 18 and a resin material that forms the covering resin 19a containing the wavelength converting material 20 may be made of the same material or different materials.

In the above-described light emitting device 700 of the seventh embodiment, the refractive index of the light diffusing agent 17, the refractive index of the covering resin 19b, the temperature dependence of the refractive index of the covering resin 19b, and the content of the light diffusing agent 17 in the covering resin 19b are determined so as to reduce a change in emission color with respect to a change in temperature. With this arrangement, the light emitting device 700 of the seventh embodiment allow the emission color to hardly change with respect to a change in temperature.

Furthermore, in the case where the light emitting device 700 of the seventh embodiment includes the light scattering particles 18, it is preferable to determine the refractive index of the light diffusing agent 17, the refractive index of the covering resin 19b, the temperature dependence of the refractive index of the covering resin 19b, and the content of the light diffusing agent 17 in the covering resin 19, in view of the relationship between the refractive index of the light scattering particles 18 and the refractive index of the covering resin 19b.

Example 1

A light emitting device according to Example 1 will be described below.

Figure 10:
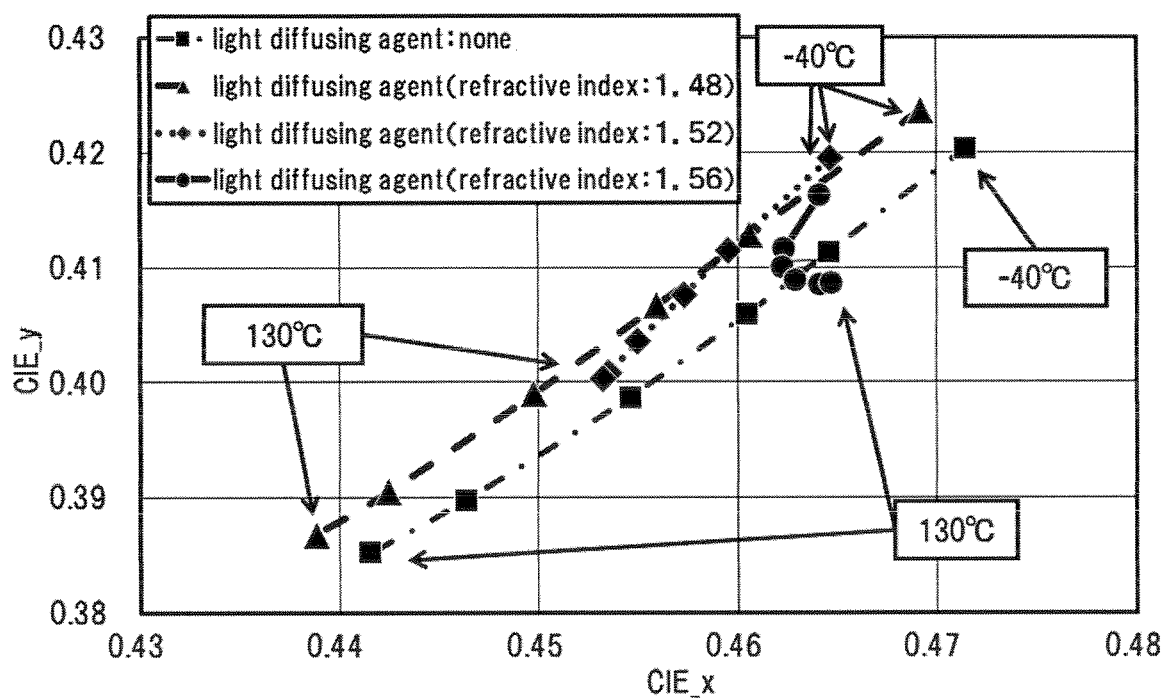
FIG. 10 is a diagram showing changes in chromaticity of light emitted from light emitting devices with respect to changes in temperature according to Example 1.

The light emitting device in Example 1 is an example of the light emitting device 300 according to the third embodiment. FIG. 4B is a cross-sectional view showing an example of the light emitting device 300. FIG. 10 is a diagram showing changes in CIE chromaticity of light emitted from the light emitting device 300 in Example 1 according to changes in temperature. Note that the values of the refractive indices in the Examples herein are at 25° C. unless otherwise specified. In Examples, the chromaticity was measured based on the JIS-8152 condition B.

In the configuration of Example 1, a blue LED is used as the light-emitting element 14 having a peak wavelength of 450 nm, and a green phosphor (YAG) and a red phosphor (SCASN) are used as the wavelength converting material 20. With this arrangement, the light emitting device 300 in Example 1 is configured to emit white light at a correlated color temperature of 2,700 K. The light emitting device 300 in Example 1 contains silicone resin with a refractive index of 1.51 (25° C., 589 nm) as the covering resin 19, and silica fillers with a refractive index of 1.46 (25° C., 589 nm) as the light scattering particles 18 (with a low refractive index). Then, in addition to the light scattering particles 18, three kinds of glass fillers having refractive indices of 1.48 (25° C., 589 nm), 1.52 (25° C., 589 nm), and 1.56 (25° C., 589 nm) are respectively contained in the covering resin 19, and no other glass fillers are contained, resulting in four kinds of light emitting devices. These four types of light emitting devices had their temperatures changed in steps from −40° C. to 130° C. (−40° C., 0° C., 25° C., 60° C., 105° C., and 130° C.), and the changes in chromaticity of each light emitting device at each of these temperatures were measured. Here, the glass filler corresponds to the light diffusing agent 17 in the third embodiment.

The refractive index of the silicon resin at wavelength of 450 nm at 25° C., refractive index of the silica filler at wavelength of 450 nm at 25° C., and refractive index of the glass filler at wavelength of 450 nm at 25° C. can be determined, for example, by linear approximation of refractive indices measured at 589 nm at 25° C. and at 486 nm at 25° C., or by linear approximation of light refractive indices measured at 486 nm at 25° C. and at 435 nm at 25° C. The refractive indices calculated using the linear approximation are as shown below. Note that the glass fillers 1 to 3 shown below are such that at wavelength of 589 nm at 25° C., the glass filler 1 has a refractive index of 1.48, the glass filler 2 has a refractive index of 1.52, and the filler 3 has a refractive index of 1.56.

The refractive index of the silicone resin: 1.52 (450 nm, 25° C.)

The refractive index of the silica filler: 1.47 (450 nm, 25° C.)

The refractive index of the glass filler 1: 1.49 (450 nm, 25° C.)

The refractive index of the glass filler 2: 1.53 (450 nm, 25° C.)

The refractive index of the glass filler 3: 1.57 (450 nm, 25° C.)

In Example 1, 5 parts by weight of the glass filler is contained in 100 parts by weight of resin components in the covering resin 19.

According to Example 1, it is confirmed that configuration in which the covering resin 19 contains the glass fillers (light diffusing agent 17) having a larger refractive index than that of the covering resin 19 allows the change in emission color of the light emitting device 300 to be reduced.

As shown in FIG. 10, in the case where the content of such a glass filler is determined to be 5 parts by weight with respect to 100 parts by weight of the covering resin, the change in chromaticity is decreased in accordance with the increase of the refractive index of the light diffusing agent 17 that has larger refractive index than that the refractive index of the covering resin 19. Note that the refractive index of the light diffusing agent 17 and the content of the light diffusing agent 17 need to be optimized based on the volume, shape, or the like of the covering resin 19 containing the light scattering particles 18, in addition to the difference in refractive index between the refractive index of the covering resin and the refractive index of the light diffusing agent.

Example 2

A light emitting device according to Example 2 will be described below.

Figure 11:
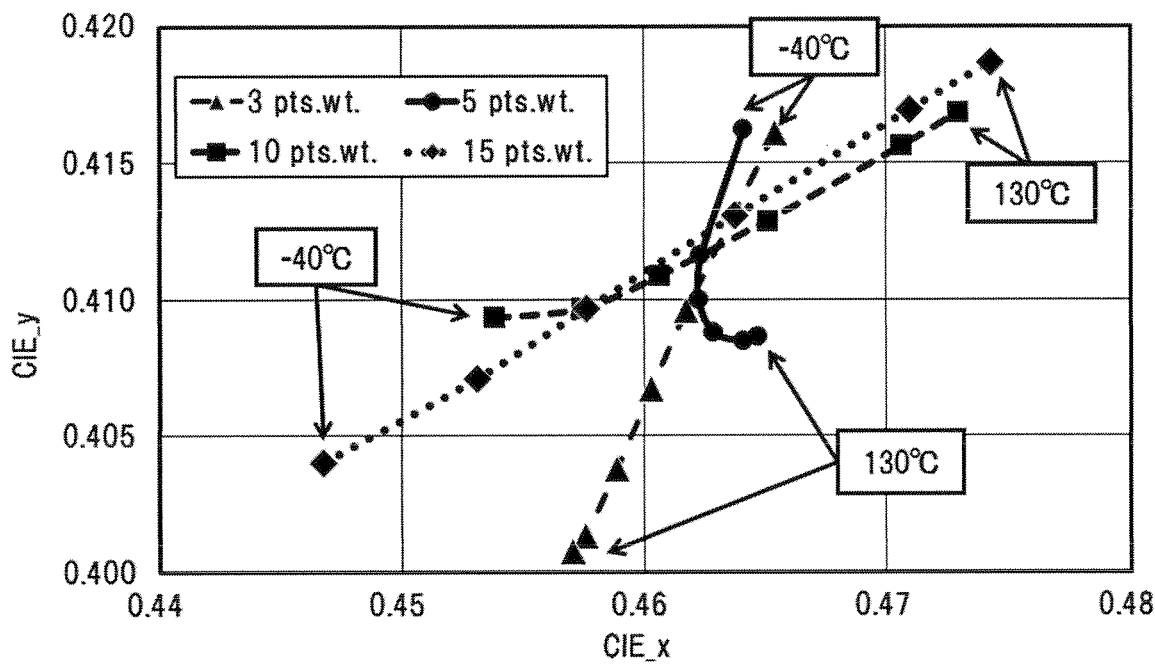
FIG. 11 is a diagram showing changes in chromaticity of light emitted from light emitting devices with respect to changes in temperature according to Example 2.

The light emitting device according to Example 2 is an example of the light emitting device 300 in the third embodiment. FIG. 4B is a cross-sectional view showing an example of the light emitting device 300. FIG. 11 is a diagram showing changes in CIE chromaticity of light emitted from the light emitting device 300 in Example 2 in accordance with changes in temperature.

In Example 2, the content of the light diffusing agent 17 contained in the covering resin 19 is changed to evaluate how reducing the change in emission color depends on the content of the light diffusing agent 17. More specifically, four types of light emitting devices are formed in which the content of glass filler (light diffusing agent 17) with a refractive index of 1.56 are respectively 3 parts by weight, 5 parts by weight, 10 parts by weight, and 15 parts by weight with respect to 100 parts by weight of the covering resin 19. Each of these four light emitting devices had its temperature changed in steps from −40° C. to 130° C. (−40° C., 0° C., 25° C., 60° C., 105° C., and 130° C.), and the changes in chromaticity of the light emitted from the light emitting device at each of these temperatures were measured.

The structures of components of the light emitting device other than the structure of the above-described light diffusing agent 17 are similar to those in Example 1.

According to Example 2, light emitted from the light emitting devices respectively containing 10 parts by weight and 15 parts by weight of the light diffusing agent 17 with respect to 100 parts by weight of the covering resin 19 contains large amount of the blue component when the temperature of the light emitting device is low, whereas the blue component decreases and a yellow component increases in accordance with the increase in temperature. On the other hand, light emitted from the light emitting device containing 3 parts by weight of the light diffusing agent 17 with respect to 100 parts by weight of the covering resin 19 contains a large amount of the yellow component when the temperature is low, whereas the amount of the yellow component decreases and the amount of the blue component increased in accordance with the increase in temperature.

As described above, the tendency of change in color component with respect to the temperature varies among the light emitting device containing 3 parts by weight of the light diffusing agent 17 in 100 parts by weight of covering resin 19, and the light emitting devices containing 10 parts by weight and 15 parts by weight of the light diffusing agent 17 in 100 parts by weight of covering resin.

In the light emitting device containing 10 parts by weight of the light diffusing agent 17 in 100 parts by weight of the covering resin 19, the changes in the amount of the blue component and the yellow component are smaller than those in the light emitting device containing 15 parts by weight of the light diffusing agent 17 in 100 parts by weight of the covering resin 19. The reason for this result is that, as the content of the light diffusing agent is increased, the total area of the interface between the covering resin 19 and particles of the light diffusing agent 17 is also increased, thus increasing the amount of scattered light. Consequently, the blue light scattered at a high temperature excessively excites the wavelength converting material 20, resulting in an excessive amount of yellow component, which in turn largely surpasses the reduction in fluorescent emission efficiency of the wavelength converting material 20 due to the rise in the temperature. From this aspect, it can be understood that, in order to reduce the change in chromaticity, it is necessary to control not only a difference in refractive index between the refractive index of the glass fillers and the refractive index of the covering resin, but also the amount of the glass fillers to be added.

Example 3

A light emitting device according to Example 3 will be described below.

Figure 12A:
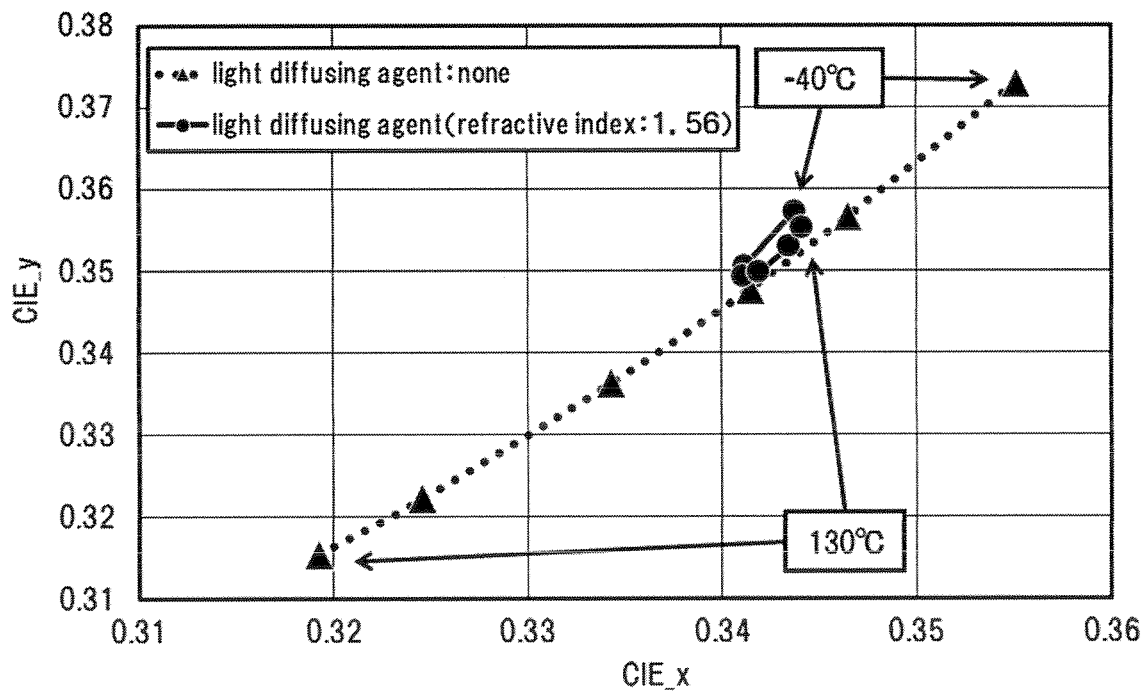
FIG. 12A is a diagram showing changes in chromaticity of light emitted from light emitting devices with respect to changes in temperature according to Example 3.
Figure 12B:
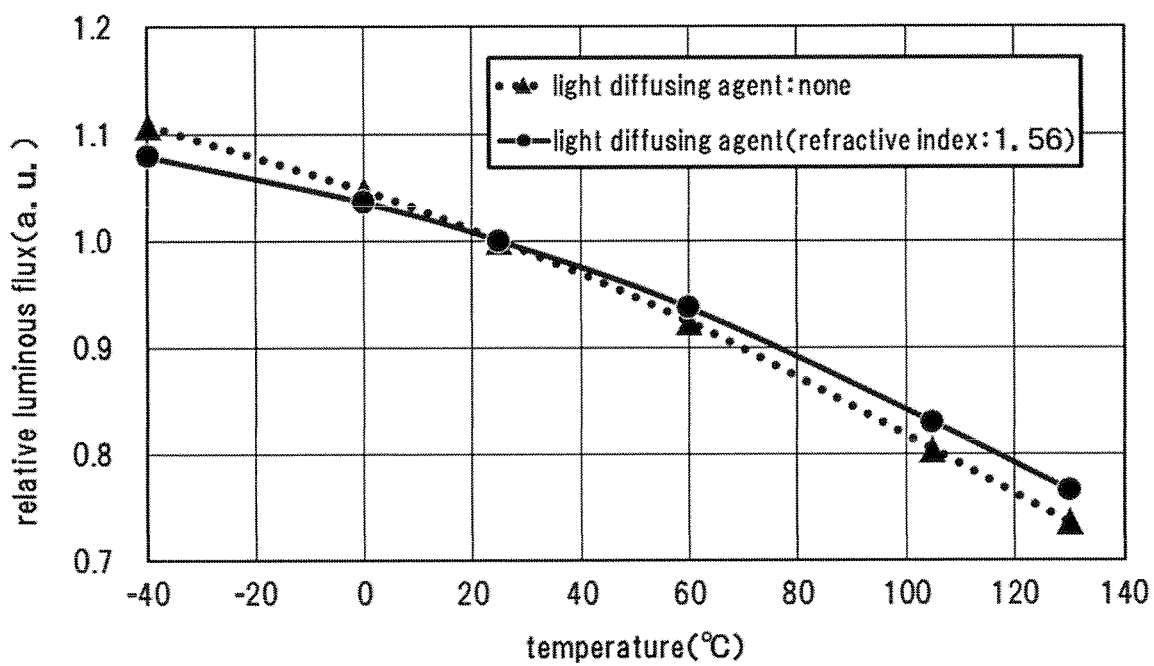
FIG. 12B is a diagram showing changes in luminous flux of light emitted from light emitting devices with respect to changes in temperature according to the Example 3.

The light emitting device in Example 3 is an example of the light emitting device 300 according to the third embodiment. FIG. 4B is a cross-sectional view showing an example of the light emitting device 300. FIG. 12A is a diagram showing changes in CIE chromaticity of light emitted from the light emitting device 300 in Example 3 with respect to changes in temperature. FIG. 12B is a diagram showing changes in luminous flux of light emitted from the light emitting device 300 in Example 3 with respect to changes in temperature.

Example 3 differs from Example 1 in that a yellowish green phosphor (LAG phosphor) and a red phosphor (SCASN) is used as the wavelength converting material 20, and blending amounts of the yellowish green phosphor (LAG phosphor) and the red phosphor (SCASN) are controlled to produce white light at a correlated color temperature of 5,000 K. In Example 3, a light emitting device containing 5 parts by weight of glass fillers with a refractive index of 1.56 in 100 parts by weight of covering resin, and a light emitting device without containing any glass filler as the light diffusing agent are fabricated and evaluated as follows. Except for the above-described structures, the light emitting devices in Example 3 are fabricated in a manner similar to that in Example 1. These two kinds of light emitting devices had their temperatures changed in steps from −40° C. to 130° C. (−40° C., 0° C., 25° C., 60° C., 105° C., and 130° C.), and the changes in chromaticity and luminous flux of light emitted from the light emitting devices were measured.

According to Example 3, even in the case where the correlated color temperature of the white light is changed from 2,700 K to 5,000 K, the addition of the light diffusing agent 17 can reduce the change in chromaticity, similarly to Example 1. Further, in view of the results of the change in luminous flux in accordance with the temperature, the addition of the light diffusing agent 17 can reduce the decrease in luminous flux at high temperatures. The main reason for this is that in the case where the light diffusing agent 17 is not included in the covering resin, the luminous flux shifts to a high color temperature side with a low spectral luminous efficiency at a high temperature.

The light emitting device of the present disclosure can be utilized in backlight light sources for liquid crystal displays, various lighting fixtures, and the like.

Although the disclosure has been described with reference to several exemplary embodiments, it is to be understood that the words that have been used are words of description and illustration, rather than words of limitation. Changes may be made within the purview of the appended claims, as presently stated and as amended, without departing from the scope and spirit of the disclosure in its aspects. Although the disclosure has been described with reference to particular examples, means, and embodiments, the disclosure may be not intended to be limited to the particulars disclosed; rather the disclosure extends to all functionally equivalent structures, methods, and uses such as are within the scope of the appended claims.

The illustrations of the examples and embodiments described herein are intended to provide a general understanding of the various embodiments, and many other examples and embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

One or more examples or embodiments of the disclosure may be referred to herein, individually, and/or collectively, by the term "disclosure" merely for convenience and without intending to voluntarily limit the scope of this application to any particular disclosure or inventive concept. Moreover, although specific examples and embodiments have been illustrated and described herein, it is to be appreciated that any subsequent arrangement designed to achieve the same or similar purpose may be substituted for the specific examples or embodiments shown. This disclosure may be intended to cover any and all subsequent adaptations or variations of various examples and embodiments. Combinations of the above examples and embodiments, and other examples and embodiments not specifically described herein, will be apparent to those of skill in the art upon reviewing the description.

In addition, in the foregoing Detailed Description, various features may be grouped together or described in a single embodiment for the purpose of streamlining the disclosure. This disclosure is not to be interpreted as reflecting an intention that the claimed embodiments require more features than are expressly recited in each claim. Rather, as the following claims reflect, inventive subject matter may be directed to less than all of the features of any of the disclosed embodiments. Thus, the following claims are incorporated into the Detailed Description, with each claim standing on its own as defining separately claimed subject matter.

The above disclosed subject matter shall be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure may be determined by the broadest permissible interpretation of the following claims and their equivalents, and shall not be restricted or limited by the foregoing detailed description.

What is claimed is:

1. A light emitting device comprising:
   a light-emitting element;
   a covering resin composed of a single layer and made of a resin material and covering the light-emitting element;
   a wavelength converting material contained in the covering resin; and
   a light diffusing agent contained in the covering resin, wherein
      the light diffusing agent contains glass particles,
      a first refractive index $n1$ of the covering resin, determined while not containing the wavelength converting material or the light diffusing agent, at a peak wavelength of a light emitted by the light-emitting element and at 25° C., is in a range of 1.48 to 1.60,
      a second refractive index $n2$ of the covering resin, determined while not containing the wavelength converting material or the light diffusing agent, at the peak wavelength and at 100° C., is at least 0.0075 lower than the first refractive index $n1$,
      a third refractive index $n3$ of the light diffusing agent, determined while not being contained in the covering resin, at the peak wavelength and at 25° C., is higher than the first refractive index $n1$, and
   the difference between the first refractive index $n1$ and the second refractive index $n2$ is 0.03 or less,
   wherein the covering resin is disposed on a light extracting surface side of the light-emitting element,
   wherein the covering resin comprises a phenyl silicone resin.

2. The light emitting device according to claim 1, wherein a difference between the first refractive index $n1$ and the third refractive index $n3$ is 0.01 to 0.1.

3. The light emitting device according to claim 1, wherein the difference between the first refractive index $n1$ and the second refractive index $n2$ is 0.025 or less.

4. The light emitting device according to claim 1, wherein the third refractive index $n3$ is in a range of 1.50 to 1.65.

5. The light emitting device according to claim 1, wherein the glass particles contain $SiO_2$ and $Al_2O_3$.

6. The light emitting device according to claim 5, wherein the glass particles contains at least one selected from the group consisting of $B_2O_3$, CaO, $Na_2O$, $ZrO_2$, SrO, $F_2$, MgO, and ZnO.

7. The light emitting device according to claim 1, wherein an emitted light from the light emitting device has CIE chromaticity coordinates, and wherein a change in an x value on the CIE chromaticity coordinates between 25° C. and 100° C. is 0.01 or less.

8. The light emitting device according to claim 1, wherein an emitted light from the light emitting device has CIE chromaticity coordinates, and a change in an x value on the CIE chromaticity coordinates between 25° C. and 100° C. is 0.005 or less.

9. The light emitting device according to claim 1, wherein an emitted light from the light emitting device has CIE chromaticity coordinates, and wherein a change in a y value on the CIE chromaticity coordinates between 25° C. and 100° C. is 0.01 or less.

10. The light emitting device according to claim 1, wherein an emitted light from the light emitting device has CIE chromaticity coordinates, and wherein a change in a y value on the CIE chromaticity coordinates between 25° C. and 100° C. is 0.005 or less.

11. The light emitting device according to claim 1, wherein an emitted light from the light emitting device has CIE chromaticity coordinates, and wherein an x value of the CIE chromaticity coordinates at 25° C. decreases compared with the x value of the CIE chromaticity coordinates at 100° C.

12. The light emitting device according to claim 1, wherein the covering resin further contains light scattering particles having a refractive index different from a refractive index of the glass particles.

13. The light emitting device according to claim 1, wherein the covering resin comprises:
a first covering resin portion at a light-emitting element side of the light emitting device, the first covering resin portion containing the wavelength converting material; and
a second covering resin portion at a light extracting surface side of the light emitting device, the second covering resin portion containing the light diffusing agent.

14. The light emitting device according to claim 1, wherein, in the covering resin, the wavelength converting material is present more densely in the vicinity of the light-emitting element than in the vicinity of a light extracting surface of the light emitting device.

15. The light emitting device according to claim 1, wherein the covering resin with the first refractive index $n1$ wraps the wavelength converting material and the light diffusing agent inside.

16. The light emitting device according to claim 1, wherein the covering resin with the first refractive index $n1$ covers one or more lateral surfaces of the light emitting element.

17. A light emitting device comprising:
a light-emitting element;
a covering resin composed of a single layer and covering the light-emitting element;
a wavelength converting material contained in the covering resin; and
a light diffusing agent contained in the covering resin, wherein
the light diffusing agent contains glass particles,
the covering resin comprises a phenyl silicone resin, and
a first refractive index $n1$ of the covering resin, determined while not containing the wavelength converting material or the light diffusing agent, at a peak wavelength of a light emitted by the light-emitting element and at 25° C., is lower than a third refractive index $n3$ of the light diffusing agent, determined while not being contained in the covering resin, at the peak wavelength and at 25° C.,
wherein the covering resin is disposed on a light extracting surface side of the light-emitting element, and
wherein the covering resin with the first refractive index $n1$ wraps the wavelength converting material and the light diffusing agent inside.

18. The light emitting device according to claim 17, wherein a difference between the first refractive index $n1$ and the third refractive index $n3$ is in a range of 0.01 to 0.1.

19. The light emitting device according to claim 17, wherein
the first refractive index $n1$ of the covering resin, at the peak wavelength and at 25° C., is in a range of 1.48 to 1.60, and
a second refractive index $n2$ of the covering resin, at the peak wavelength and at 100° C., is at least 0.0075 lower than the first refractive index $n1$.

20. The light emitting device according to claim 19, wherein the difference between the first refractive index $n1$ and the second refractive index $n2$ is 0.025 or less.

21. The light emitting device according to claim 17, wherein the third refractive index $n3$ is in a range of 1.50 to 1.65.

22. The light emitting device according to claim 17, wherein the glass particles contain $SiO_2$ and $Al_2O_3$.

23. The light emitting device according to claim 22, wherein the glass particles contains at least one selected from the group consisting of $B_2O_3$, $CaO$, $Na_2O$, $ZrO_2$, $SrO$, $F_2$, $MgO$, and $ZnO$.

24. The light emitting device according to claim 17, wherein an emitted light from the light emitting device has CIE chromaticity coordinates, and wherein a change in an x value on the CIE chromaticity coordinates between 25° C. and 100° C. is 0.01 or less.

25. The light emitting device according to claim 17, wherein an emitted light from the light emitting device has CIE chromaticity coordinates, and wherein a change in an x value on the CIE chromaticity coordinates between 25° C. and 100° C. is 0.005 or less.

26. The light emitting device according to claim 17, wherein an emitted light from the light emitting device has CIE chromaticity coordinates, and wherein a change in a y value on the CIE chromaticity coordinates between 25° C. and 100° C. is 0.01 or less.

27. The light emitting device according to claim 17, wherein an emitted light from the light emitting device has CIE chromaticity coordinates, and wherein a change in a y value on the CIE chromaticity coordinates between 25° C. and 100° C. is 0.005 or less.

28. The light emitting device according to claim 17, wherein an emitted light from the light emitting device has CIE chromaticity coordinates, and wherein an x value of the CIE chromaticity coordinates at 25° C. decreases compared with the x value of the CIE chromaticity coordinates at 100° C.

29. The light emitting device according to claim 17, wherein the covering resin further contains light scattering particles having a refractive index different from a refractive index of the glass particles.

30. The light emitting device according to claim 17, wherein the covering resin comprises:

a first covering resin portion at a light-emitting element side of the light emitting device, the first covering resin portion containing the wavelength converting material; and a second covering resin portion at a light extracting surface side of the light emitting device, the second covering resin portion containing the light diffusing agent.

31. The light emitting device according to claim 17, wherein, in the covering resin, the wavelength converting material is present more densely in the vicinity of the light-emitting element than in the vicinity of a light extracting surface of the light emitting device.

32. The light emitting device according to claim 17, wherein the covering resin with the first refractive index n1 covers one or more lateral surfaces of the light emitting element.

33. A light emitting device comprising:

a light-emitting element;

a covering resin composed of a single layer and covering the light-emitting element;

a wavelength converting material contained in the covering resin; and a light diffusing agent contained in the covering resin, wherein the light diffusing agent contains glass particles, the covering resin comprises a phenyl silicone resin, and a first refractive index n1 of the covering resin, determined while not containing the wavelength converting material or the light diffusing agent, at a peak wavelength of a light emitted by the light-emitting element and at 25° C., is lower than a third refractive index n3 of the light diffusing agent, determined while not being contained in the covering resin, at the peak wavelength and at 25° C., wherein the covering resin is disposed on a light extracting surface side of the light-emitting element, and wherein the covering resin further contains light scattering particles having a refractive index different from a refractive index of the glass particles.

* * * * *